(12) United States Patent
Tham et al.

(10) Patent No.: US 11,810,700 B2
(45) Date of Patent: Nov. 7, 2023

(54) IN-PLANE MAGNETIZED FILM, IN-PLANE MAGNETIZED FILM MULTILAYER STRUCTURE, HARD BIAS LAYER, MAGNETORESISTIVE ELEMENT, AND SPUTTERING TARGET

(71) Applicant: TANAKA KIKINZOKU KOGYO K.K., Tokyo (JP)

(72) Inventors: Kim Kong Tham, Tsukuba (JP); Ryousuke Kushibiki, Tsukuba (JP); Masahiro Aono, Tsukuba (JP); Yasunobu Watanabe, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 421 days.

(21) Appl. No.: 17/289,500

(22) PCT Filed: Oct. 30, 2019

(86) PCT No.: PCT/JP2019/042628
§ 371 (c)(1),
(2) Date: Apr. 28, 2021

(87) PCT Pub. No.: WO2020/090914
PCT Pub. Date: May 7, 2020

(65) Prior Publication Data
US 2021/0391105 A1    Dec. 16, 2021

(30) Foreign Application Priority Data

Oct. 30, 2018  (JP) .................. 2018-204303

(51) Int. Cl.
*H01F 10/16*   (2006.01)
*C23C 14/34*   (2006.01)
*H01F 41/18*   (2006.01)

(52) U.S. Cl.
CPC .......... *H01F 10/16* (2013.01); *C23C 14/3407* (2013.01); *H01F 41/18* (2013.01)

(58) Field of Classification Search
CPC . C23C 14/3407; C23C 14/3414; H01F 10/16; H01F 41/18; H01F 10/123; H01F 41/183; H10N 50/10
See application file for complete search history.

(56) References Cited

U.S. PATENT DOCUMENTS 6,069,820 A    5/2000    Inomata et al.
7,767,322 B2   8/2010    Mukai
(Continued)

FOREIGN PATENT DOCUMENTS

JP    H11-238925 A    8/1999
JP    2001-093130 A   4/2001
(Continued)

OTHER PUBLICATIONS

Jan. 7, 2019 International Search Report issued in International Patent Application No. PCT/JP2019/042628.
(Continued)

*Primary Examiner* — Lawrence D Ferguson
(74) *Attorney, Agent, or Firm* — Oliff PLC

(57) ABSTRACT

A CoPt-oxide-based in-plane magnetized film having a magnetic coercive force of 2.00 kOe or more and remanent magnetization per unit area Mrt of 2.00 memu/cm² or more. The in-plane magnetized film for use as a hard bias layer of a magnetoresistive element contains metal Co, metal Pt, and an oxide. The in-plane magnetized film contains the metal Co in an amount of 55 at % or more and less than 95 at % and the metal Pt in an amount of more than 5 at % and 45 at % or less relative to a total of metal components of the in-plane magnetized film, and contains the oxide in an amount of 10 vol % or more and 42 vol % or less relative
(Continued)

to a whole amount of the in-plane magnetized film. The in-plane magnetized film has a thickness of 20 nm or more and 80 nm or less.

20 Claims, 5 Drawing Sheets

(56) References Cited

U.S. PATENT DOCUMENTS

| | | | |
|---|---|---|---|
| 8,218,270 | B1 | 7/2012 | Zeltser et al. |
| 9,275,662 | B2 | 3/2016 | Isowaki et al. |
| 10,490,731 | B2 | 11/2019 | Sasaki et al. |
| 10,510,948 | B2 | 12/2019 | Sasaki |
| 10,522,742 | B2 | 12/2019 | Shiokawa et al. |
| 10,586,916 | B2 | 3/2020 | Shiokawa et al. |
| 10,636,633 | B2 | 4/2020 | Tham et al. |
| 10,892,401 | B2 | 1/2021 | Sasaki et al. |
| 10,964,885 | B2 | 3/2021 | Sasaki |
| 2003/0138671 | A1 | 7/2003 | Oikawa et al. |
| 2005/0255337 | A1 | 11/2005 | Mukai |
| 2006/0292705 | A1 | 12/2006 | Hegde et al. |
| 2008/0052896 | A1 | 3/2008 | Tsuchiya et al. |
| 2009/0274931 | A1 | 11/2009 | Qiu et al. |
| 2010/0330395 | A1 | 12/2010 | Zhang et al. |
| 2013/0057274 | A1 | 3/2013 | Ide et al. |
| 2013/0107616 | A1 | 5/2013 | Ohno et al. |
| 2014/0037836 | A1 | 2/2014 | Kunliang et al. |
| 2014/0037989 | A1 | 2/2014 | Kunliang et al. |
| 2015/0269956 | A1 | 9/2015 | Isowaki et al. |
| 2017/0194131 | A1 | 7/2017 | Tham et al. |
| 2018/0337326 | A1 | 11/2018 | Sasaki |
| 2018/0350417 | A1 | 12/2018 | Shiokawa et al. |
| 2018/0351082 | A1 | 12/2018 | Sasaki et al. |
| 2018/0351083 | A1 | 12/2018 | Sasaki |
| 2018/0351084 | A1 | 12/2018 | Sasaki |
| 2018/0351085 | A1 | 12/2018 | Shiokawa et al. |
| 2020/0035911 | A1 | 1/2020 | Sasaki et al. |
| 2020/0083434 | A1 | 3/2020 | Sasaki et al. |
| 2020/0083439 | A1 | 3/2020 | Sasaki |
| 2021/0184106 | A1 | 6/2021 | Sasaki |
| 2021/0391105 | A1 | 12/2021 | Tham et al. |

FOREIGN PATENT DOCUMENTS

| | | | |
|---|---|---|---|
| JP | 2003-123240 | A | 4/2003 |
| JP | 2003-178423 | A | 6/2003 |
| JP | 2005-353256 | A | 12/2005 |
| JP | 2006-107625 | A | 4/2006 |
| JP | 2008-283016 | A | 11/2008 |
| JP | 2008-547150 | A | 12/2008 |
| JP | 2009-253066 | A | 10/2009 |
| JP | 2011-008907 | A | 1/2011 |
| JP | 2012-216275 | A | 11/2012 |
| JP | 2013-055281 | A | 3/2013 |
| JP | 2015-185183 | A | 10/2015 |
| JP | 6620913 | B1 | 12/2019 |
| JP | 6845300 | B2 | 3/2021 |
| WO | 2007/002011 | A1 | 1/2007 |
| WO | 2012/004883 | A1 | 1/2012 |
| WO | 2015/166795 | A1 | 11/2015 |
| WO | 2020/090914 | A1 | 5/2020 |

OTHER PUBLICATIONS

H. Ohmori and A. Maesaka., "Structure and Magnetic Properties of Co-Pt Alloy Film Deposited on an Ru Underlayer", Journal of the Magnetic Society of Japan, vol. 26, 269-273(2002).

T. Kanbe et al., "Magnetic Properties and Microstructure of CoPt—Al2O3 Granular Media", Journal of the Magnetic Society of Japan, vol. 24, 291-294(2000).

R. L. Paldi et al. "Strain-Driven In-plane Ordering in Vertically Aligned ZnO—Au Nanocomposites with Highly Correlated Metamaterial Properties", ACS Omega 2020, 5, 2234-2241.

Ohmori et al., "High Coercivity Recording Media Prepared Using Non-heating Process", Journal of the Magnetic Society of Japan, vol. 25, No. 4-2, p. 607-610, 2001.

Jul. 27, 2021 International Search Report issued in International Patent Application No. PCT/JP2021/016940.

Aug. 3, 2021 International Search Report issued in International Patent Application No. PCT/JP2021/016941.

Oct. 27, 2022 International Preliminary Report on Patentability issued in International Patent Application No. PCT/ JP2021/016940.

Aug. 16, 2022 International Preliminary Report on Patentability issued in International Patent Application No. PCT/ JP2021/016941.

Sep. 7, 2022 Office Action issued in Chinese Patent Application No. 201980071989.6.

U.S. Appl. No. 17/920,865, filed Oct. 24, 2022 in the name of Ryousuke Kushibiki et al.

U.S. Appl. No. 17/921,005, filed Oct. 24, 2022 in the name of Ryousuke Kushibiki et al.

Aug. 23, 2022 International Preliminary Report on Patentability issued in International Patent Application No. PCT/JP2021/016941.

May 24, 2022 Written Opinion issued in International Patent Application No. PCT/JP2021/016941.

IN-PLANE MAGNETIZED FILM, IN-PLANE MAGNETIZED FILM MULTILAYER STRUCTURE, HARD BIAS LAYER, MAGNETORESISTIVE ELEMENT, AND SPUTTERING TARGET

TECHNICAL FIELD

The present invention relates to an in-plane magnetized film, an in-plane magnetized film multilayer structure, a hard bias layer, a magnetoresistive element, and a sputtering target, and more particularly relates to a CoPt-oxide-based in-plane magnetized film, a CoPt-oxide-based in-plane magnetized film multilayer structure, and a hard bias layer that can achieve magnetic performance of a magnetic coercive force Hc of 2.00 kOe or more and remanent magnetization per unit area Mrt of 2.00 memu/cm$^2$ or more, without adopting film formation on a heated substrate (hereafter also referred to as high-temperature film formation), and also relates to a magnetoresistive element and a sputtering target that are related to the CoPt-oxide-based in-plane magnetized film, the CoPt-oxide-based in-plane magnetized film multilayer structure, or the hard bias layer. The CoPt-oxide-based in-plane magnetized film and the CoPt-oxide-based in-plane magnetized film multilayer structure are usable in a hard bias layer of a magnetoresistive element.

It is conceivable that a hard bias layer having a magnetic coercive force Hc of 2.00 kOe or more and remanent magnetization per unit area Mrt of 2.00 memu/cm$^2$ or more has as much or more magnetic coercive force and remanent magnetization than a hard bias layer of an existing magnetoresistive element. In the present application, the hard bias layer refers to a thin-film magnet that applies a bias magnetic field to a magnetic layer exhibiting a magnetoresistance effect (hereinafter also referred to as a free magnetic layer).

BACKGROUND ART

Currently, magnetic sensors are used in many fields, and one of the magnetic sensors used commonly is a magnetoresistive element.

A magnetoresistive element has a magnetic layer exhibiting a magnetoresistance effect (free magnetic layer) and a hard bias layer applying a bias magnetic field to the magnetic layer (free magnetic layer), and the hard bias layer is required to be able to apply a magnetic field of a predetermined strength or more to the free magnetic layer in a stable manner.

Thus, the hard bias layer is required to have a high magnetic coercive force and high remanent magnetization.

However, hard bias layers of existing magnetoresistive elements have a magnetic coercive force of about 2 kOe (for example, FIG. 7 of Patent Literature 1), and so an increase in the magnetic coercive force is desired.

The hard bias layer is also required to have remanent magnetization per unit area of about 2 memu/cm$^2$ or more (for example, paragraph 0007 of Patent Literature 2).

There is a technique described in Patent Literature 3 to accommodate thereto. In the technique described in Patent Literature 3, a seed layer (a composite seed layer including a Ta layer and a metal layer, which is formed on the Ta layer and has a face-centered cubic (111) crystal structure or a hexagonal closest packed (001) crystal structure) is provided between a sensor laminate (a laminate having a free magnetic layer) and a hard bias layer so as to orient a magnetic material such that an easy axis is oriented along a longitudinal direction, for the purpose of increasing the magnetic coercive force of the hard bias layer. However, the above-described magnetic characteristics required of the hard bias layer are not satisfied. In this technique, the seed layer provided between the sensor laminate and the hard bias layer needs to be thick in order to increase the magnetic coercive force. Therefore, the structure also has the problem of weakening a magnetic field to be applied to the free magnetic layer in the sensor laminate.

Patent Literature 4 describes use of FePt as a magnetic material to be used in a hard bias layer, the FePt hard bias layer having a Pt or Fe seed layer, and a Pt or Fe capping layer. Patent Literature 4 suggests a structure in which Pt or Fe contained in the seed layer and the capping layer and FePt contained in the hard bias layer are mixed with each other during annealing at an annealing temperature of approximately 250 to 350° C. However, in a heating process required for formation of the hard bias layer, it is necessary to consider effects on other films that have already been stacked. Thus, the heating process is a process to avoid as much as possible.

Patent Literature 5 describes that an annealing temperature can be lowered to about 200° C. by optimization of the annealing temperature. Patent Literature 5 describes that the magnetic coercive force of a hard bias layer is 3.5 kOe or more, but the remanent magnetization per unit area thereof is about 1.2 memu/cm$^2$, which does not satisfy the above-described magnetic characteristics required of the hard bias layer.

Patent Literature 6 describes a magnetic recording medium for longitudinal recording, the magnetic layers of which have a granular structure constituted of ferromagnetic crystal grains in a hexagonal closest packed structure and a nonmagnetic grain boundary, which surrounds the ferromagnetic crystal grains and is mainly made of an oxide. There have been no examples of such a granular structure used in a hard bias layer of a magnetoresistive element. The technique described in Patent Literature 6 aims at reduction in a signal-to-noise ratio, which is an object of a magnetic recording medium. The magnetic layers are stacked in layers by interposing a nonmagnetic layer between the magnetic layers. The upper and lower magnetic layers are coupled by an antiferromagnetic coupling, and hence have a structure unsuitable for increasing the magnetic coercive force of the magnetic layers.

CITATION LIST

Patent Literature

Patent Literature 1: JP2008-283016
Patent Literature 2: JP2008-547150
Patent Literature 3: JP2011-008907
Patent Literature 4: US2009/0274931A1
Patent Literature 5: JP2012-216275
Patent Literature 6: JP2003-178423

SUMMARY OF INVENTION

Technical Problem

When the application to an actual magnetoresistive element is considered, a sensor laminate (a laminate having a free magnetic layer) and a hard bias layer are preferably made as thin as possible. Also, no film formation with heating is preferably performed.

In order to obtain a hard bias layer having a higher magnetic coercive force than that (about 2 kOe) of hard bias layers of existing magnetoresistive elements and higher remanent magnetization per unit area than that (about 2 memu/cm$^2$) of the hard bias layers of the existing magnetoresistive elements, with the foregoing conditions satisfied, the inventors considered that it was necessary to search for different elements or compounds from elements or compounds used in the existing hard bias layers. The inventors believed that application of an oxide in a CoPt-based in-plane magnetized film might been promising. The inventors also considered that multilayering of the CoPt-based in-plane magnetized film, to which the oxide was applied, with the use of a nonmagnetic intermediate layer might been promising.

In consideration of the aforementioned circumstances, an object of the present invention is to provide an in-plane magnetized film, an in-plane magnetized film multilayer structure, and a hard bias layer that can achieve magnetic performance of a magnetic coercive force Hc of 2.00 kOe or more and remanent magnetization per unit area Mrt of 2.00 memu/cm$^2$ or more, without adopting film formation with heating. A supplemental object of the present invention is to provide a magnetoresistive element and a sputtering target that are related to the in-plane magnetized film, the in-plane magnetized film multilayer structure, or the hard bias layer.

Solution to Problem

The present invention has solved the above-described problems by the following in-plane magnetized film, in-plane magnetized film multilayer structure, hard bias layer, magnetoresistive element, and sputtering target.

That is, an in-plane magnetized film according to the present invention is an in-plane magnetized film for use as a hard bias layer of a magnetoresistive element. The in-plane magnetized film is characterized by containing metal Co, metal Pt, and an oxide, by containing the metal Co in an amount of 55 at % or more and less than 95 at % and the metal Pt in an amount of more than 5 at % and 45 at % or less relative to the total of metal components of the in-plane magnetized film, by containing the oxide in an amount of 10 vol % or more and 42 vol % or less relative to the whole amount of the in-plane magnetized film, and by having a thickness of 20 nm or more and 80 nm or less.

In the present application, the hard bias layer refers to a thin-film magnet that applies a bias magnetic field to a free magnetic layer exhibiting a magnetoresistance effect.

In the present application, "remanent magnetization per unit area" of the in-plane magnetized film refers to the value obtained by multiplying remanent magnetization per unit volume of the in-plane magnetized film by the thickness of the in-plane magnetized film.

The in-plane magnetized film may be configured to have a granular structure constituted of CoPt alloy crystal grains and a crystal grain boundary made of the oxide.

The crystal grain boundary used herein refers to a boundary of the crystal grains.

The oxide may contain at least one of a Ti oxide, a Si oxide, a W oxide, a B oxide, a Mo oxide, a Ta oxide, and a Nb oxide.

A first aspect of an in-plane magnetized film multilayer structure according to the present invention is an in-plane magnetized film multilayer structure for use as a hard bias layer of a magnetoresistive element, and is characterized in the following points. The in-plane magnetized film multilayer structure has a plurality of in-plane magnetized films and a nonmagnetic intermediate layer, and the nonmagnetic intermediate layer is disposed between the in-plane magnetized films. The in-plane magnetized films adjacent across the nonmagnetic intermediate layer are coupled by a ferromagnetic coupling. The in-plane magnetized film contains metal Co, metal Pt, and an oxide. The in-plane magnetized film contains the metal Co in an amount of 55 at % or more and less than 95 at % and the metal Pt in an amount of more than 5 at % and 45 at % or less relative to the total of metal components of the in-plane magnetized film, and contains the oxide in an amount of 10 vol % or more and 42 vol % or less relative to the whole amount of the in-plane magnetized film. The in-plane magnetized film multilayer structure has a magnetic coercive force of 2.00 kOe or more and remanent magnetization per unit area of 2.00 memu/cm$^2$ or more.

In the present application, the nonmagnetic intermediate layer refers to a nonmagnetic layer disposed between the in-plane magnetized films.

In the present application, the ferromagnetic coupling refers to a coupling based on an exchange interaction produced when spins of magnetic layers (here, the in-plane magnetized films) that are adjacent across the nonmagnetic intermediate layer are in parallel (directed in the same direction).

In the present application, the "remanent magnetization per unit area" of the in-plane magnetized film multilayer structure refers to the value obtained by multiplying remanent magnetization per unit volume of the in-plane magnetized films included in the in-plane magnetized film multilayer structure by the total thickness of the in-plane magnetized films included in the in-plane magnetized film multilayer structure.

A second aspect of an in-plane magnetized film multilayer structure according to the present invention is an in-plane magnetized film multilayer structure for use as a hard bias layer of a magnetoresistive element, and is characterized in the following points. The in-plane magnetized film multilayer structure has a plurality of in-plane magnetized films and a nonmagnetic intermediate layer the crystal structure of which is a hexagonal closest packed structure, and the nonmagnetic intermediate layer is disposed between the in-plane magnetized films and the in-plane magnetized films adjacent across the nonmagnetic intermediate layer are coupled by a ferromagnetic coupling. The in-plane magnetized film contains metal Co, metal Pt, and an oxide. The in-plane magnetized film contains the metal Co in an amount of 55 at % or more and less than 95 at % and the metal Pt in an amount of more than 5 at % and 45 at % or less relative to the total of metal components of the in-plane magnetized film, and contains the oxide in an amount of 10 vol % or more and 42 vol % or less relative to the whole amount of the in-plane magnetized film. A total thickness of the plurality of in-plane magnetized films is 20 nm or more.

The nonmagnetic intermediate layer is preferably made of Ru or a Ru alloy.

In the in-plane magnetized film multilayer structure, the in-plane magnetized films may be configured to have a granular structure constituted of CoPt alloy crystal grains and a crystal grain boundary made of the oxide.

In the in-plane magnetized film multilayer structure, the oxide may contain at least one of a Ti oxide, a Si oxide, a W oxide, a B oxide, a Mo oxide, a Ta oxide, and a Nb oxide.

A hard bias layer according to the present invention is a hard bias layer characterized by having the in-plane magnetized film or the in-plane magnetized film multilayer structure.

A magnetoresistive element according to the present invention is a magnetoresistive element characterized by having the hard bias layer.

A sputtering target according to the present invention is characterized in the following points. The sputtering target is for use in forming an in-plane magnetized film for use as at least part of a hard bias layer of a magnetoresistive element by room temperature film formation. The sputtering target contains metal Co, metal Pt, and an oxide. The sputtering target contains the metal Co in an amount of 60 at % or more and less than 95 at % and the metal Pt in an amount of more than 5 at % and 40 at % or less relative to the total of metal components of the sputtering target, and contains the oxide in an amount of 10 vol % or more and 40 vol % or less relative to the whole amount of the sputtering target. The in-plane magnetized film to be formed using by the sputtering target has a magnetic coercive force of 2.00 kOe or more and remanent magnetization per unit area of 2.00 memu/cm$^2$ or more.

The room temperature film formation used herein refers to formation of a film without heating a substrate.

Advantageous Effects of Invention

According to the present invention, it is possible to provide an in-plane magnetized film, an in-plane magnetized film multilayer structure, and a hard bias layer that can achieve magnetic performance of a magnetic coercive force Hc of 2.00 kOe or more and remanent magnetization per unit area Mrt of 2.00 memu/cm$^2$ or more, without adopting film formation with heating.

DESCRIPTION OF EMBODIMENTS (1) First Embodiment

Figure 1:
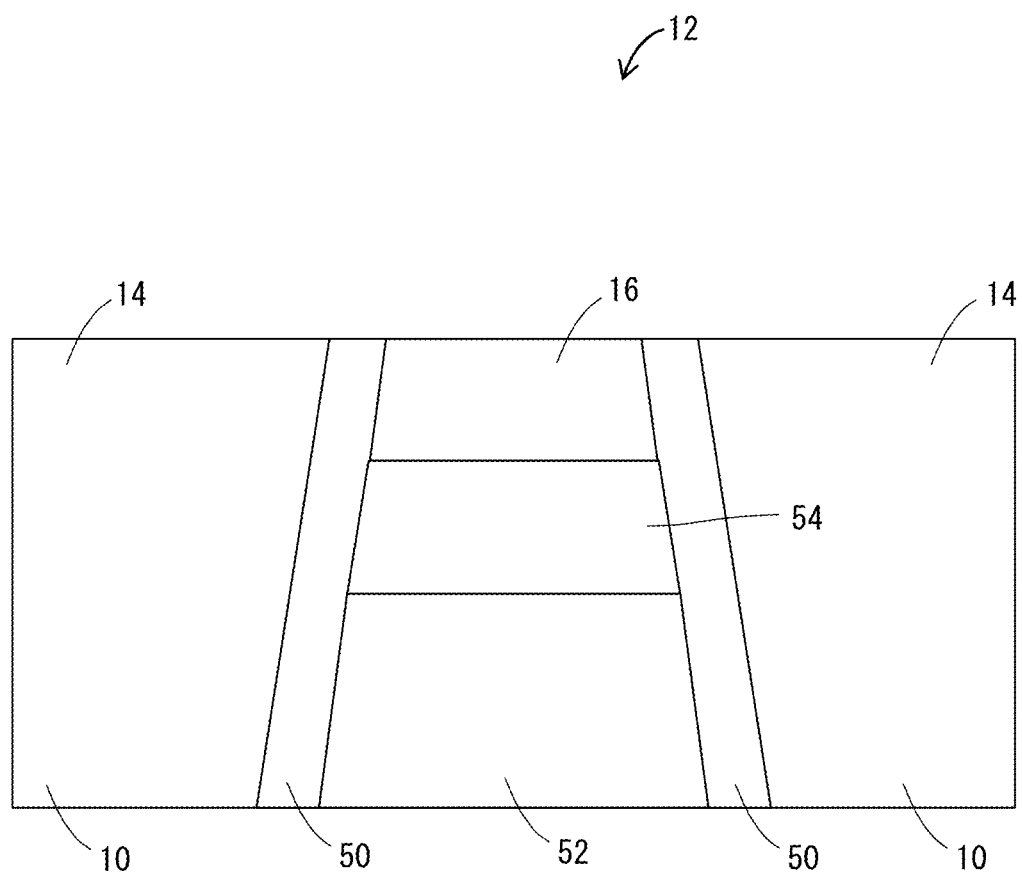
FIG. 1 is a cross-sectional view schematically showing a state in which a CoPt-oxide-based in-plane magnetized film 10 according to a first embodiment of the present invention is applied to a hard bias layer 14 of a magnetoresistive element 12.

FIG. 1 is a cross-sectional view schematically showing a state in which an in-plane magnetized film 10 according to a first embodiment of the present invention is applied to a hard bias layer 14 of a magnetoresistive element 12. In FIG. 1, a substrate layer (the in-plane magnetized film 10 is formed on the substrate layer) is omitted.

A detailed discussion of the structure shown in FIG. 1 is as follows, with a tunneling magnetoresistive element as a magnetoresistive element 12 in mind. Note that the in-plane magnetized film 10 according to the first embodiment is not limited to application to a hard bias layer of the tunneling magnetoresistive element and is capable of being applied to, for example, a hard bias layer of a giant magnetoresistive element or an anisotropic magnetoresistive element.

The magnetoresistive element 12 (here, the tunneling magnetoresistive element) has two ferromagnetic layers (a free magnetic layer 16 and a pinned layer 52) separated by an extremely thin nonmagnetic tunnel barrier layer (hereinafter, a barrier layer 54). The direction of magnetization of the pinned layer 52 is fixed by securing the pinned layer 52 on an adjoining antiferromagnetic layer (not shown) by an exchange coupling, or the like. The direction of magnetization of the free magnetic layer 16 can freely rotate with respect to the direction of magnetization of the pinned layer 52, under the presence of an external magnetic field. Since the rotation of the free magnetic layer 16 with respect to the direction of magnetization of the pinned layer 52 by the external magnetic field causes a change in electric resistance, the detection of the change in the electric resistance allows for the detection of the external magnetic field.

The hard bias layer 14 plays a role in stabilizing a magnetization direction axis of the free magnetic layer 16 by applying a bias magnetic field to the free magnetic layer 16. An insulating layer 50 made of an electrically insulating material plays a role in preventing diversion of a sensor current that flows through a sensor laminate (the free magnetic layer 16, the barrier layer 54, and the pinned layer 52) in a vertical direction into the hard bias layer 14 on both sides of the sensor laminate (the free magnetic layer 16, the barrier layer 54, and the pinned layer 52).

As shown in FIG. 1, the in-plane magnetized film 10 according to the first embodiment is able to be used as the hard bias layer 14 of the magnetoresistive element 12 and to apply the bias magnetic field to the free magnetic layer 16, which exhibits a magnetoresistance effect. The hard bias layer 14 is composed of only the in-plane magnetized film 10 according to the first embodiment, and thus, is constituted of a single layer of the in-plane magnetized film 10.

The in-plane magnetized film 10 according to the first embodiment is a single-layer in-plane magnetized film that contains an oxide and has as much or more magnetic coercive force (a magnetic coercive force of 2.00 kOe or more) as compared with that of the hard bias layers of existing magnetoresistive elements and remanent magnetization per unit area (2.00 memu/cm$^2$ or more). To be more specific, the in-plane magnetized film 10 according to the first embodiment is a CoPt-oxide-based in-plane magnetized film that contains metal Co, metal Pt, and an oxide, that contains the metal Co in an amount of 55 at % or more and less than 95 at % and the metal Pt in an amount of more than 5 at % and 45 at % or less relative to the total of metal components of the in-plane magnetized film, that contains the oxide in an amount of 10 vol % or more and 42 vol % or less relative to the whole amount of the in-plane magnetized film, and that has a thickness of 20 nm or more and 80 nm or less.

In this application, the metal Co may be simply described as Co, the metal Pt may be simply described as Pt, and the metal Ru may be simply described as Ru. Other metal elements may be described as in the same manner.

(1-1) Components of In-Plane Magnetized Film 10

As described above, the in-plane magnetized film 10 according to the first embodiment contains Co and Pt as metal components, and also contains an oxide.

The metal Co and the metal Pt become components of magnetic crystal grains (minute magnets) in the in-plane magnetized film to be formed by sputtering.

Cobalt is a ferromagnetic metallic element, and plays a dominant role in forming the magnetic crystal grains (minute magnets) in the in-plane magnetized film. From the viewpoint of increasing a crystal magnetic anisotropy constant Ku of CoPt alloy crystal grains (magnetic crystal grains) in the in-plane magnetized film obtained by sputtering and also from the viewpoint of maintaining the magnetization of the CoPt alloy crystal grains (magnetic crystal grains) in the in-plane magnetized film obtained, the content ratio of Co in the in-plane magnetized film according to the present embodiment is set at 55 at % or more and less than 95 at % relative to the total of metal components of the in-plane magnetized film. From the similar viewpoint, the content ratio of Co in the in-plane magnetized film according to the present embodiment is preferably 55 at % or more and 80 at % or less, and more preferably 65 at % or more and 75 at % or less, relative to the total of the metal components of the in-plane magnetized film.

Platinum is alloyed with Co in a predetermined composition range to have the function of reducing the magnetic moment of the alloy. As a result, it plays a role in controlling the strength of magnetism of the magnetic crystal grains. Moreover, Pt has the function of increasing a magnetic coercive force of the in-plane magnetized film by increasing a crystal magnetic anisotropy constant Ku of the CoPt alloy crystal grains (magnetic crystal grains) in the in-plane magnetized film obtained by sputtering. From the viewpoint of increasing the magnetic coercive force of the in-plane magnetized film and also from the viewpoint of controlling the magnetism of the CoPt alloy crystal grains (magnetic crystal grains) in the in-plane magnetized film, the content ratio of Pt in the in-plane magnetized film according to the present embodiment is set at 5 at % or more and 45 at % or less relative to the total of the metal components of the in-plane magnetized film. From the similar viewpoint, the content ratio of Pt in the in-plane magnetized film according to the present embodiment is preferably 20 at % or more and 40 at % or less, and more preferably 25 at % or more and 35 at % or less, relative to the total of the metal components of the in-plane magnetized film.

The oxide contained in the in-plane magnetized film 10 according to the first embodiment contains at least one of a Ti oxide, a Si oxide, a W oxide, a B oxide, a Mo oxide, a Ta oxide, and a Nb oxide. In the in-plane magnetized film 10, a nonmagnetic material made of an oxide such as those described above partitions the CoPt alloy magnetic crystal grains to form a granular structure. That is, the granular structure is constituted of the CoPt alloy crystal grains and a crystal grain boundary of the oxide surrounding the CoPt alloy crystal grains.

Accordingly, an increase in the content of the oxide in the in-plane magnetized film 10 is preferable because it can facilitate reliable partitioning among the magnetic crystal grains and the independence of the magnetic crystal grains from one another. From this viewpoint, the content of the oxide in the in-plane magnetized film 10 according to the first embodiment is set at an amount of 10 vol % or more. From the similar viewpoint, the content of the oxide in the in-plane magnetized film 10 according to the first embodiment is preferably 12.5 vol % or more, and more preferably 15 vol % or more.

However, if the content of the oxide in the in-plane magnetized film 10 is too high, the oxide mixed in the CoPt alloy crystal grains (magnetic crystal grains) might have an adverse effect on crystallinity of the CoPt alloy crystal grains (magnetic crystal grains), and the ratio of structures other than a hcp might increase in the CoPt alloy crystal grains (magnetic crystal grains). From the similar viewpoint, the content of the oxide in the in-plane magnetized film 10 according to the first embodiment is set at 42 vol % or less. Similarly, the content of the oxide in the in-plane magnetized film 10 according to the first embodiment is preferably 37.5 vol % or less, and more preferably 35 vol % or less.

Accordingly, in the first embodiment, the content of the oxide in the in-plane magnetized film 10 is set at 10 vol % or more and 42 vol % or less, and the content of the oxide in the in-plane magnetized film 10 according to the first embodiment is preferably 12.5 vol % or more and 37.5 vol % or less, and more preferably 15 vol % or more and 35 vol % or less.

As is verified in examples described later, since containing $WO_3$ or $MoO_3$ as the oxide brings about an increase in a magnetic coercive force Hc of the in-plane magnetized film 10, $WO_3$ or $MoO_3$ is preferably contained as the oxide.

Note that in the existing in-plane magnetized films, since a single element such as Cr, W, Ta, or B is used as a grain boundary material for partitioning CoPt alloy crystal grains (magnetic crystal grains), it is conceivable that the grain boundary material forms a solid solution in a CoPt alloy to some extent. Thus, it is conceivable that the CoPt alloy crystal grains (magnetic crystal grains) of the existing in-plane magnetized films have reduced saturation magnetization and reduced remanent magnetization due to an adverse effect on crystallinity, and the values of a magnetic coercive force Hc and remanent magnetization of the existing in-plane magnetized films are adversely affected.

In contrast, in the in-plane magnetized film 10 according to the first embodiment, since a grain boundary material is made of the oxide, the grain boundary material is unlikely to form a solid solution in the CoPt alloy, as compared with a case where the grain boundary material is the single element such as Cr, W, Ta, or B. Therefore, the saturation magnetization and remanent magnetization of the CoPt alloy crystal grains (magnetic crystal grains) increase in the in-plane magnetized film 10 according to the first embodiment, and hence the in-plane magnetized film 10 according to the first embodiment has an increased magnetic coercive force Hc and increased remanent magnetization. This will be verified in examples described later.

(1-2) Thickness of in-plane magnetized film 10

As is verified in examples described later, if the thickness of a CoPt—$WO_3$ in-plane magnetized film (a case where a single layer without a nonmagnetic intermediate layer is used) is less than 20 nm, remanent magnetization per unit area Mrt becomes less than 2.00 memu/cm$^2$ (Comparative Example 7). If the thickness of the CoPt—$WO_3$ in-plane magnetized film (the case where a single layer without a nonmagnetic intermediate layer is used) is more than 80 nm, a magnetic coercive force Hc becomes less than 2.00 kOe (Comparative Examples 8 and 9). Thus, the thickness of the in-plane magnetized film 10 according to the first embodiment in which the CoPt—$WO_3$ in-plane magnetized film is a single layer is set to 20 nm or more and 80 nm or less.

However, as is verified in examples described later, the magnetic coercive force Hc becomes high when the thickness of the CoPt—$WO_3$ in-plane magnetized film being a single layer is 20 to 40 nm (Examples 9, 12, and 13). The magnetic coercive force Hc becomes extremely high when the thickness of the CoPt—$WO_3$ in-plane magnetized film being a single layer is 20 to 30 nm (Examples 9 and 12). Therefore, the thickness of the in-plane magnetized film according to the first embodiment is preferably 20 to 40 nm, and more preferably 20 to 30 nm.

(1-3) Magnetic Coercive Force and Remanent Magnetization of In-Plane Magnetized Film 10

The in-plane magnetized film 10 according to the first embodiment is a single-layer in-plane magnetized film that has as much or more magnetic coercive force (a magnetic coercive force of 2.00 kOe or more) as compared with that of the hard bias layers of existing magnetoresistive elements and as much or more remanent magnetization per unit area (2.00 memu/cm$^2$ or more).

As described later in a second embodiment in details, it is possible to further increase the magnetic coercive force, while the value of the remanent magnetization is maintained, by multilayering the in-plane magnetized film 10 according to the first embodiment by using one or more intervening nonmagnetic intermediate layers 22 (refer to FIG. 2). This will be verified later in examples.

(1-4) Substrate Film

As a substrate film used in forming the in-plane magnetized film 10 according to the first embodiment, a substrate film that is made of metal Ru or a Ru alloy having the same crystal structure (hexagonal closest packed structure hcp) as that of the magnetic grains (CoPt alloy grains) of the in-plane magnetized film 10 is suitable.

To give a systematic in-plane orientation of the magnetic crystal grains (CoPt alloy grains) of the laminated in-plane magnetized film (CoPt-oxide) 10, it is preferable that a lot of (10.0) planes or (11.0) planes are disposed on a surface of the used Ru substrate film or Ru alloy substrate film.

The substrate film used in forming the in-plane magnetized film according to the present invention is not limited to the Ru substrate film or Ru alloy substrate film, but any substrate film is usable as long as the substrate film is able to give the in-plane orientation of the CoPt magnetic crystal grains and to promote magnetic separation of the CoPt magnetic crystal grains in the obtained in-plane magnetized film.

(1-5) Sputtering Target

A sputtering target used in producing the in-plane magnetized film 10 according to the first embodiment is a sputtering target that is used in producing the in-plane magnetized film 10 by room temperature film formation, where the in-plane magnetized film 10 is used as at least part of the hard bias layer 14 of the magnetoresistive element 12. The sputtering target contains metal Co, metal Pt, and an oxide. The sputtering target contains the metal Co in an amount of 60 at % or more and less than 95 at % and the metal Pt in an amount of more than 5 at % and 40 at % or less relative to the total of metal components of the sputtering target, and contains the oxide in an amount of 10 vol % or more and 40 vol % or less relative to the whole amount of the sputtering target. The in-plane magnetized film to be formed has a magnetic coercive force of 2.00 kOe or more, and remanent magnetization per unit area of 2.00 memu/cm$^2$ or more. As described in "(J) Analysis of composition of produced CoPt-oxide-based in-plane magnetized film" later, there is a deviation between the actual composition (composition obtained by an analysis of composition) of the produced CoPt-oxide-based in-plane magnetized film and the composition of the sputtering target used in producing the CoPt-oxide-based in-plane magnetized film, and so the composition range of each element contained in the above-described sputtering target is a composition range set in consideration of the deviation, and does not coincide with the composition range of each element contained in the in-plane magnetized film 10 according to the first embodiment.

A description about components (metal Co, metal Pt, and an oxide) of the sputtering target is the same as that about the components of the in-plane magnetized film described in the above-described "(1-1) Components of in-plane magnetized film 10", and so the description is omitted.

(1-6) Method for Forming In-Plane Magnetized Film 10

The in-plane magnetized film 10 according to the first embodiment is formed on a predetermined substrate film (the substrate film described in the above-described "(1-4) Substrate film") by sputtering using a sputtering target described in the above-described "(1-5) Sputtering target". Note that, heating is unnecessary in this film formation process, and the in-plane magnetized film 10 according to the first embodiment can be formed by room temperature film formation.

(2) Second Embodiment

Figure 2:
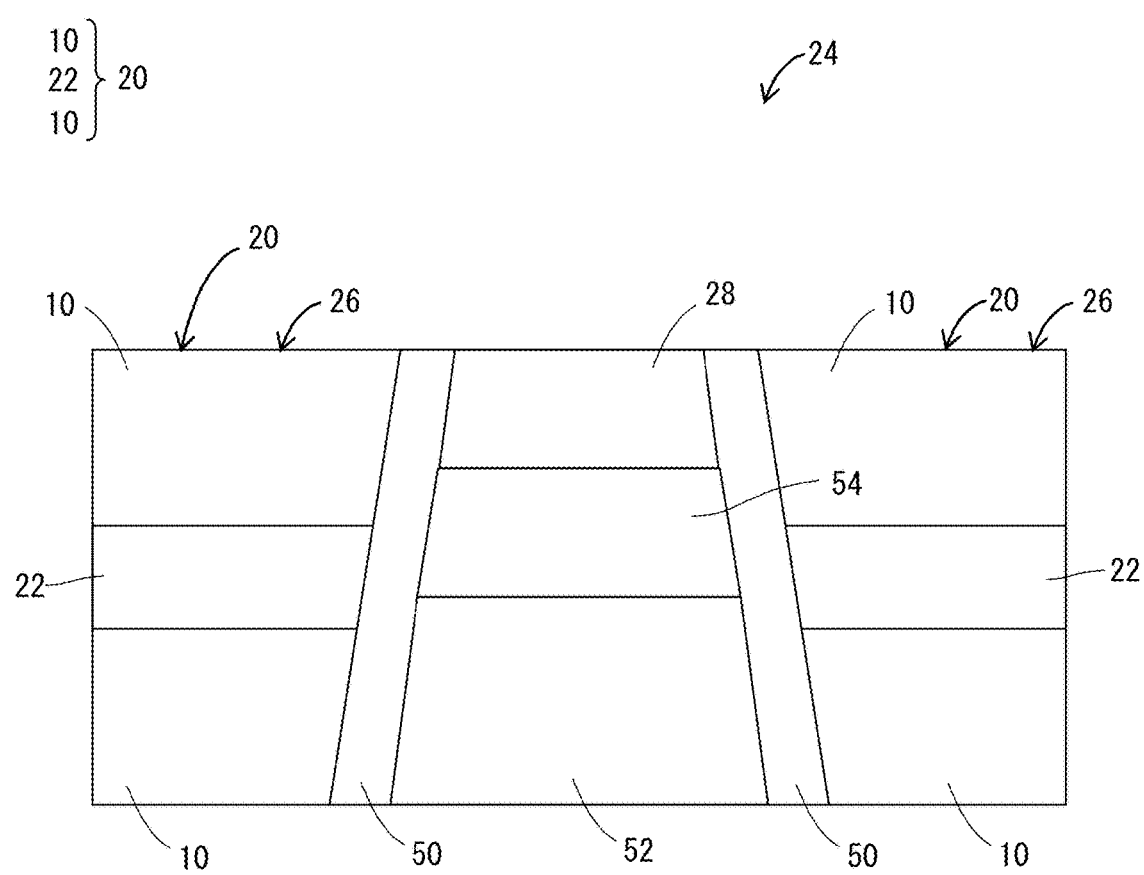
FIG. 2 is a cross-sectional view schematically showing a state in which an in-plane magnetized film multilayer structure 20 according to a second embodiment of the present invention is applied to a hard bias layer 26 of a magnetoresistive element 24.

FIG. 2 is a cross-sectional view schematically showing a state in which an in-plane magnetized film multilayer structure 20 according to a second embodiment of the present invention is applied to a hard bias layer 26 of a magnetoresistive element 24.

Hereinafter, the in-plane magnetized film multilayer structure 20 according to the second embodiment will be described, but the components of the in-plane magnetized film 10, the magnetic coercive force and remanent magnetization of the in-plane magnetized film 10, the substrate film that is used in producing the in-plane magnetized film 10, the sputtering target that is used in producing the in-plane magnetized film 10, and the method for forming the in-plane magnetized film 10 have already been described in "(1) First Embodiment", and descriptions thereof are omitted.

As shown in FIG. 2, the in-plane magnetized film multilayer structure 20 according to the second embodiment of the present invention has a plurality of the in-plane magnetized films 10 according to the first embodiment, and further has a nonmagnetic intermediate layer 22 between the plurality of in-plane magnetized films 10 according to the first embodiment. Thus, the structure 20 has a stacked structure in which the plurality of in-plane magnetized films 10 are stacked via the non-magnetic intermediate layer 22.

In the in-plane magnetized film multilayer structure 20, the thickness per one layer of the in-plane magnetized films 10 is typically 5 nm or more and 30 nm or less. The total thickness (total of thicknesses) of the in-plane magnetized film 10 is set to 20 nm or more from the viewpoint of adjusting the remanent magnetization Mrt to be 2 meum/cm$^2$ or more. Further, with respect to the upper limit of the total thickness (total of thicknesses) of the in-plane magnetized film 10, as will be described later, the adjacent in-plane magnetized films 10 separated by the interposition of the nonmagnetic intermediate layer 22 are coupled via a ferromagnetic coupling, and so, even if the total thickness (total of thicknesses) of the in-plane magnetized film 10 increases, the magnetic coercive force Hc does not decrease in theory, and there is no upper limit. Actually, it is confirmed by examples described later that the magnetic coercive force Hc is kept at 2 kOe or more at least when the total thickness (total of thicknesses) is up to 100 nm. In addition, the thickness per one layer of the in-plane magnetized films 10 in the in-plane magnetized film multilayer structure 20 is preferably 5 nm or more and 15 nm or less, and more preferably 10 nm or more and 15 nm or less, from the viewpoint of increasing the magnetic coercive force Hc more.

The in-plane magnetized film multilayer structure 20 according to the second embodiment can be used as the hard bias layer 26 of the magnetoresistive element 24, so that it is possible to apply a bias magnetic field to a free magnetic layer 28 exhibiting a magnetoresistive effect.

The nonmagnetic intermediate layer 22 is interposed between the in-plane magnetized films 10 according to the first embodiment, so as to play a role in separating the in-plane magnetized films 10 and multilayering the in-plane magnetized films 10. Multilayering the in-plane magnetized films 10 with the nonmagnetic intermediate layer 22 interposed therebetween can further increase the magnetic coercive force Hc while maintaining the value of the remanent magnetization Mrt.

The adjacent in-plane magnetized films 10 separated with the nonmagnetic intermediate layer 22 interposed therebetween are disposed so that spins are in parallel (directed in the same direction). Since disposing them in this manner allows the adjacent in-plane magnetized films 10 separated by the interposition of the nonmagnetic intermediate layer 22 to be coupled by a ferromagnetic coupling, the in-plane magnetized film 10 can further increase the magnetic coercive force Hc while maintaining the value of the remanent magnetization Mrt.

Therefore, the in-plane magnetized film multilayer structure 20 according to the second embodiment can exhibit a good magnetic coercive force Hc.

The metal used in the non-magnetic intermediate layer 22 is metal having the same crystal structure as those of CoPt alloy magnetic crystal grains (hexagonal closest packed structure hcp) from the viewpoint of not impairing the crystal structure of the CoPt alloy magnetic crystal grains. Specifically, as the non-magnetic intermediate layer 22, there may be suitably used metal Ru or a Ru alloy, which has the same crystal structure as the crystal structure of the CoPt alloy magnetic crystal grains in the in-plane magnetized film 10 (hexagonal closest packed structure hcp).

Specific examples of the additive element when the metal used in the non-magnetic intermediate layer 22 is a Ru alloy may include Cr, Pt, and Co. The added amount of those metals is preferably in a range in which the Ru alloy takes a hexagonal closest packed structure hcp.

Bulk samples of a Ru alloy were produced by performing an arc welding, and X-ray diffraction peaks were analyzed by an X-ray diffraction device (XRD: SmartLab manufactured by Rigaku Corporation). In a RuCr alloy, when the added amount of Cr was 50 at %, a mixed phase of the hexagonal closest packed structure hcp and $RuCr_2$ was confirmed. Thus, when a RuCr alloy is used for the nonmagnetic interlayer 22, the added amount of Cr is suitably less than 50 at %, preferably less than 40 at %, and more preferably less than 30 at %. In a RuPt alloy, when the added amount of Pt was 15 at %, a mixed phase of the hexagonal closest packed structure hcp and a face-centered cubic structure fcc derived from Pt was confirmed. Thus, when a RuPt alloy is used for the nonmagnetic interlayer 22, the added amount of Pt is suitably less than 15 at %, preferably less than 12.5 at %, and more preferably less than 10 at %. Regardless of the added amount of Co, the RuCo alloy forms the hexagonal closest packed structure hcp, but when adding Co in an amount of 40 at % or more, the RuCo alloy becomes a magnetic material. Thus, the added amount of Co is suitably less than 40 at %, preferably less than 30 at %, and more preferably less than 20 at %.

The thickness of the nonmagnetic intermediate layer 22 is preferably 0.3 nm or more and 3 nm or less. As demonstrated in examples described later, using a nonmagnetic intermediate layer made of metal Ru or a Ru alloy and having a thickness of 0.3 nm or more and 3 nm or less can increase the magnetic coercive force Hc of the in-plane magnetized film 10 by about 15%. However, if the nonmagnetic intermediate layer has a thickness of 0.3 nm or more and 3 nm or less, the effect of increasing the magnetic coercive force He of the in-plane magnetized film 10 is substantially constant. Thus, from the viewpoints of material cost reduction and ease of application to the magnetoresistive element (the thinner, the easier the material is used for the magnetoresistive element), the thickness of the nonmagnetic intermediate layer 22 is more preferably 0.3 nm or more and 1.5 nm or less, and particularly preferably 0.3 nm or more and 0.6 nm or less.

EXAMPLES

Examples and comparative examples of the CoPt-oxide-based in-plane magnetized film will be hereinafter described to verify the present invention. In the following (A), the composition ratios of Co and Pt, which are metal components of the CoPt-oxide-based in-plane magnetized film, are studied. In the following (B), the volume ratio of an oxide ($WO_3$) of the CoPt-oxide-based in-plane magnetized film is studied. In the following (C), the thickness of the CoPt-oxide-based in-plane magnetized film is studied. In the following (D), the type of an oxide of the CoPt-oxide-based in-plane magnetized film is studied. In the following (E) to (I), multilayering of the CoPt-oxide-based in-plane magnetized film by using one or more nonmagnetic intermediate layers is described.

In the following (J), analysis of composition was performed on CoPt—$WO_3$-based in-plane magnetized films according to Examples 45, 47, 50, and 52 in order to check the degree of a deviation between the actual composition (composition obtained by the analysis of composition) of a produced CoPt-oxide-based in-plane magnetized film and the composition of a sputtering target used in producing the CoPt-oxide-based in-plane magnetized film. As a result, it was found out that a deviation occurred between the composition of an in-plane magnetized film and the composition of the sputtering target used in producing the in-plane magnetized film. Accordingly, the composition of CoPt-oxide-based in-plane magnetized films, except for the CoPt-oxide-based in-plane magnetized films according to Examples 45, 47, 50, and 52 the composition of which was actually analyzed, was calculated from the composition of sputtering targets used in production in consideration of the deviation that had been found out from a result of the analysis of composition of Examples 45, 47, 50, and 52, and assumed to be the composition of the CoPt-oxide-based in-plane magnetized film according to each example.

(A) Study about Composition Ratio of Co and Pt being Metal Components of CoPt-Oxide-Based In-Plane Magnetized Film (Examples 1 to 7 and Comparative Examples 1 and 2)

Experimental data was obtained with varying the composition of Co and Pt, which were metal components of a CoPt-oxide-based in-plane magnetized film to be formed on a Ru substrate film. The CoPt-oxide-based in-plane magnetized film to be formed was a single layer without a nonmagnetic intermediate layer. The details are as follows.

A Ru substrate film was formed on a Si substrate using ES-3100W manufactured by EIKO ENGINEERING, LTD. by sputtering so as to have a thickness of 30 nm, and a CoPt-oxide-based in-plane magnetized film was formed thereon using the same apparatus by sputtering so as to have a thickness of 50 nm. In this film formation process, room temperature film formation was performed without heating the substrate. Note that, in examples and comparative examples of the present application, a sputtering apparatus used in sputtering is ES-3100W manufactured by EIKO ENGINEERING, LTD., and a description of the name of the apparatus will be omitted hereinbelow.

Samples were produced with varying the content ratio of Pt, relative to the total of Co and Pt being the metal components of the CoPt-oxide-based in-plane magnetized film to be formed, from 5.7 at % to 50.5 at % in increments of 5.6 at %, and data was obtained.

A hysteresis loop of each of the produced CoPt-oxide-based in-plane magnetized films was measured using a vibrating magnetometer (VSM: TM-VSM211483-HGC manufactured by TAMAKAWA CO., LTD.) (hereinafter referred to as a vibrating magnetometer). From the measured hysteresis loop, a magnetic coercive force Hc (kOe) and remanent magnetization Mr (memu/cm$^3$) were read. By multiplying the read remanent magnetization Mr (memu/cm$^3$) by the film thickness 50 nm of the produced CoPt-oxide-based in-plane magnetized film, remanent magnetization per unit area Mrt (memu/cm$^2$) of the produced CoPt-oxide-based in-plane magnetized film was calculated. The results are shown in the following Table 1.

the CoPt-oxide-based in-plane magnetized film is 5.7 at %, and so Comparative Example 1 is not within the scope of the present invention. Comparative Example 1 has a magnetic coercive force Hc of 1.47 kOe, which is less than 2.00 kOe. In Comparative Example 2, the content of Pt relative to the total of the metal components (Co and Pt) of the CoPt-oxide-based in-plane magnetized film is 50.5 at %, and so Comparative Example 2 is not within the scope of the present invention. Comparative Example 2 has remanent magnetization per unit area Mrt of 1.62 memu/cm$^2$, which is less than 2.00 memu/cm$^2$.

(B) Study about Volume Ratio of Oxide (WO$_3$) of CoPt-Oxide-Based in-Plane Magnetized Film (Examples 8 to 11 and Comparative Examples 3 to 6)

Experimental data was obtained with varying the volume ratio of the oxide (WO$_3$) of a CoPt-oxide-based in-plane magnetized film to be formed on a Ru substrate film. The CoPt-oxide-based in-plane magnetized film to be formed was a single layer, without a nonmagnetic intermediate layer. The details are as follows.

A Ru substrate film was formed on a Si substrate by sputtering so as to have a thickness of 30 nm, and a CoPt-oxide-based in-plane magnetized film was formed thereon by sputtering so as to have a thickness of 30 nm. In this film formation process, room temperature film formation was performed without heating the substrate.

Samples were produced with varying the volume ratio of the oxide (WO$_3$) of the CoPt-oxide-based in-plane magnetized film to be formed, from 0 vol % to 51.8 vol % in

TABLE 1

| | Composition of target | Composition of in-plane magnetized film | Thickness of in-plane magnetized film (nm) | Magnetic coercive force Hc (kOe) | Remanent magnetization per unit area Mrt (memu/cm$^2$) |
|---|---|---|---|---|---|
| Comparative Example 1 | (Co—5Pt)-30 vol % WO$_3$ | (Co—5.7Pt)-31.0 vol % WO$_3$ | 50 | 1.47 | 7.22 |
| Example 1 | (Co—10Pt)-30 vol % WO$_3$ | (Co—11.3Pt)-31.0 vol % WO$_3$ | 50 | 2.21 | 6.44 |
| Example 2 | (Co—15Pt)-30 vol % WO$_3$ | (Co—16.9Pt)-31.0 vol % WO$_3$ | 50 | 2.75 | 5.60 |
| Example 3 | (Co—20Pt)-30 vol % WO$_3$ | (Co—22.5Pt)-31.0 vol % WO$_3$ | 50 | 3.19 | 4.78 |
| Example 4 | (Co—25Pt)-30 vol % WO$_3$ | (Co—28.1Pt)-31.0 vol % WO$_3$ | 50 | 3.41 | 4.08 |
| Example 5 | (Co—30Pt)-30 vol % WO$_3$ | (Co—33.7Pt)-31.0 vol % WO$_3$ | 50 | 4.04 | 3.28 |
| Example 6 | (Co—35Pt)-30 vol % WO$_3$ | (Co—39.3Pt)-31.0 vol % WO$_3$ | 50 | 3.66 | 2.46 |
| Example 7 | (Co—40Pt)-30 vol % WO$_3$ | (Co—44.9Pt)-31.0 vol % WO$_3$ | 50 | 3.14 | 2.14 |
| Comparative Example 2 | (Co—45Pt)-30 vol % WO$_3$ | (Co—50.5Pt)-31.0 vol % WO$_3$ | 50 | 2.37 | 1.62 |

As can be seen from Table 1, in Examples 1 to 7, the content of Pt relative to the total of the metal components (Co and Pt) of the CoPt-oxide-based in-plane magnetized film is 10 to 45 at %, the volume ratio of an oxide (WO$_3$) relative to the whole of the CoPt-oxide-based in-plane magnetized film is 31.0 vol %, and the thickness is 50 nm, and so Examples 1 to 7 are within the scope of the present invention. They achieve magnetic performance of a magnetic coercive force Hc of 2.00 kOe or more and remanent magnetization per unit area Mrt of 2.00 memu/cm$^2$ or more by the room temperature film formation without heating the substrate.

In contrast, in comparative Example 1, the content of Pt relative to the total of the metal components (Co and Pt) of increments of 5.2 vol % or 10.4 vol % (or 10.5 vol %), and data was obtained.

A hysteresis loop of each of the produced CoPt-oxide-based in-plane magnetized films was measured using a vibrating magnetometer. From the measured hysteresis loop, a magnetic coercive force Hc (kOe) and remanent magnetization Mr (memu/cm$^3$) were read. By multiplying the read remanent magnetization Mr (memu/cm$^3$) by the film thickness 30 nm of the produced CoPt-oxide-based in-plane magnetized film, remanent magnetization per unit area Mrt (memu/cm$^2$) of the produced CoPt-oxide-based in-plane magnetized film was calculated. The results are shown in the following Table 2.

TABLE 2

|  | Composition of target | Composition of in-plane magnetized film | Thickness of in-plane magnetized film (nm) | magnetic coercive force Hc (kOe) | Remanent magnetization per unit area Mrt (memu/cm²) |
|---|---|---|---|---|---|
| Comparative Example 3 | Co—20Pt | Co—22.5Pt | 30 | 1.34 | 11.23 |
| Comparative Example 4 | (Co—20Pt)-5 vol % $WO_3$ | (Co—22.5Pt)-4.9 vol % $WO_3$ | 30 | 1.59 | 6.56 |
| Example 8 | (Co—20Pt)-10 vol % $WO_3$ | (Co—22.5Pt)-10.1 vol % $WO_3$ | 30 | 2.20 | 3.87 |
| Example 9 | (Co—20Pt)-20 vol % $WO_3$ | (Co—22.5Pt)-20.5 vol % $WO_3$ | 30 | 3.94 | 2.88 |
| Example 10 | (Co—20Pt)-30 vol % $WO_3$ | (Co—22.5Pt)-31.0 vol % $WO_3$ | 30 | 4.07 | 2.30 |
| Example 11 | (Co—20Pt)-40 vol % $WO_3$ | (Co—22.5Pt)-41.4 vol % $WO_3$ | 30 | 4.41 | 2.02 |
| Comparative Example 5 | (Co—20Pt)-45 vol % $WO_3$ | (Co—22.5Pt)-46.6 vol % $WO_3$ | 30 | 3.67 | 1.77 |
| Comparative Example 6 | (Co—20Pt)-50 vol % $WO_3$ | (Co—22.5Pt)-51.8 vol % $WO_3$ | 30 | 2.82 | 1.53 |

As can be seen from Table 2, in Examples 8 to 11, the volume ratio of the oxide ($WO_3$) relative to the whole amount of the CoPt-oxide-based in-plane magnetized film is 10 to 42 vol %, the content of Pt relative to the total of the metal components (Co and Pt) of the CoPt-oxide-based in-plane magnetized film is 22.5 at %, and the thickness is 30 nm, and so Examples 8 to 11 are within the scope of the present invention. They achieve magnetic performance of a magnetic coercive force Hc of 2.00 kOe or more and remanent magnetization per unit area Mrt of 2.00 memu/cm² or more by the room temperature film formation without heating the substrate.

In contrast, in comparative Example 3, the volume ratio of the oxide ($WO_3$) relative to the whole amount of the CoPt-oxide-based in-plane magnetized film is 0 vol %, and so comparative Example 3 is not within the scope of the present invention. Comparative Example 3 has a magnetic coercive force Hc of 1.34 kOe, which is less than 2.00 kOe. In Comparative Example 4, the volume ratio of the oxide ($WO_3$) relative to the whole amount of the CoPt-oxide-based in-plane magnetized film is 4.9 vol %, and so Comparative Example 4 is not within the scope of the present invention. Comparative Example 4 has a magnetic coercive force Hc of 1.59 kOe, which is less than 2.00 kOe. In Comparative Example 5, the volume ratio of the oxide ($WO_3$) relative to the whole amount of the CoPt-oxide-based in-plane magnetized film is 46.6 vol %, and so Comparative Example 5 is not within the scope of the present invention. Comparative Example 5 has remanent magnetization per unit area Mrt of 1.77 memu/cm², which is less than 2.00 memu/cm². In Comparative Example 6, the volume ratio of the oxide ($WO_3$) relative to the whole amount of the CoPt-oxide-based in-plane magnetized film is 51.8 vol %, Comparative Example 6 is not within the scope of the present invention. Comparative Example 6 has remanent magnetization per unit area Mrt of 1.53 memu/cm², which is less than 2.00 memu/cm².

(C) Study about Thickness of CoPt-Oxide-Based In-Plane Magnetized Film (Examples 9 and 12 to 17 and Comparative Examples 7 to 9)

Experimental data was obtained with varying the thickness of a CoPt-oxide-based in-plane magnetized film (Co-22.5Pt)-20.5 vol % $WO_3$ to be formed on a Ru substrate film. The CoPt-oxide-based in-plane magnetized film (Co-22.5Pt)-20.5 vol % $WO_3$ to be formed was a single layer, without a nonmagnetic intermediate layer. The details are as follows.

A Ru substrate film was formed on a Si substrate by sputtering so as to have a thickness of 30 nm, and a CoPt-oxide-based in-plane magnetized film (Co-22.5Pt)-20.5 vol % $WO_3$ was formed thereon by sputtering. In this film formation process, room temperature film formation was performed without heating the substrate.

Samples were produced with varying the thickness of the CoPt-oxide-based in-plane magnetized film (Co-22.5Pt)-20.5 vol % $WO_3$ to be formed, from 10 nm to 100 nm in increments of 10 nm, and data was obtained.

Here, the thickness of the in-plane magnetized film (Co-22.5Pt)-20.5 vol % $WO_3$ of each sample can be calculated from a sputtering rate and a sputtering time. The sputtering rate was calculated from the relationship between the thickness of the formed in-plane magnetized film (Co-22.5Pt)-20.5 vol % $WO_3$ and the sputtering time, measured in advance. At this time, the thickness of the in-plane magnetized film (Co-22.5Pt)-20.5 vol % $WO_3$ was calculated by obtaining a difference in height in a film thickness direction when a stylus had passed through a film adhering portion and a film non-adhering portion under a load of 100 μN, using a stylus profiler (DektakXT manufactured by BRUKER). Furthermore, the vertical cross section of the in-plane magnetized film (Co-22.5Pt)-20.5 vol % $WO_3$ of each sample was observed by TEM (transmission electron microscope) (H-9500 manufactured by Hitachi High-Tech Corporation) to check the thickness of the film.

A hysteresis loop of each of the produced CoPt-oxide-based in-plane magnetized films was measured using a vibrating magnetometer. From the measured hysteresis loop, a magnetic coercive force Hc (kOe) and remanent magnetization Mr (memu/cm³) were read. By multiplying the read remanent magnetization Mr (memu/cm³) by the film thickness of the produced CoPt-oxide-based in-plane magnetized film, remanent magnetization per unit area Mrt (memu/cm²) of the produced CoPt-oxide-based in-plane magnetized film was calculated. The results are shown in the following Table 3.

TABLE 3

| | Composition of target | Composition of in-plane magnetized film | Thickness of in-plane magnetized film (nm) | magnetic coercive force Hc (kOe) | Remanent magnetization per unit area Mrt (memu/cm$^2$) |
|---|---|---|---|---|---|
| Comparative Example 7 | (Co—20Pt)-20 vol % WO$_3$ | (Co—22.5Pt)-20.5 vol % WO$_3$ | 10 | 3.89 | 1.26 |
| Example 12 | (Co—20Pt)-20 vol % WO$_3$ | (Co—22.5Pt)-20.5 vol % WO$_3$ | 20 | 3.74 | 2.02 |
| Example 9 | (Co—20Pt)-20 vol % WO$_3$ | (Co—22.5Pt)-20.5 vol % WO$_3$ | 30 | 3.94 | 2.88 |
| Example 13 | (Co—20Pt)-20 vol % WO$_3$ | (Co—22.5Pt)-20.5 vol % WO$_3$ | 40 | 3.57 | 3.29 |
| Example 14 | (Co—20Pt)-20 vol % WO$_3$ | (Co—22.5Pt)-20.5 vol % WO$_3$ | 50 | 2.97 | 4.19 |
| Example 15 | (Co—20Pt)-20 vol % WO$_3$ | (Co—22.5Pt)-20.5 vol % WO$_3$ | 60 | 2.67 | 4.99 |
| Example 16 | (Co—20Pt)-20 vol % WO$_3$ | (Co—22.5Pt)-20.5 vol % WO$_3$ | 70 | 2.38 | 5.76 |
| Example 17 | (Co—20Pt)-20 vol % WO$_3$ | (Co—22.5Pt)-20.5 vol % WO$_3$ | 80 | 2.08 | 6.56 |
| Comparative Example 8 | (Co—20Pt)-20 vol % WO$_3$ | (Co—22.5Pt)-20.5 vol % WO$_3$ | 90 | 1.78 | 7.35 |
| Comparative Example 9 | (Co—20Pt)-20 vol % WO$_3$ | (Co—22.5Pt)-20.5 vol % WO$_3$ | 100 | 1.49 | 8.12 |

As can be seen from Table 3, in Examples 9 and 12 to 17, the thickness of the CoPt-oxide-based in-plane magnetized film (Co-22.5Pt)-20.5 vol % WO$_3$ is 20 to 80 nm, and so Examples 9 and 12 to 17 are within the scope of the present invention. They achieve magnetic performance of a magnetic coercive force Hc of 2.00 kOe or more and remanent magnetization per unit area Mrt of 2.00 memu/cm$^2$ or more by the room temperature film formation without heating the substrate.

Among Examples 9 and 12 to 17, Examples 9, 12, and 13 in which the thickness of the CoPt-oxide-based in-plane magnetized film (Co-22.5Pt)-20.5 vol % WO$_3$ is 20 to 40 nm, have a magnetic coercive force Hc of 3.5 kOe or more. The thinner film can facilitate the application to magnetoresistive elements, and reduce material costs. Thus, it is conceivable that the thickness of the CoPt-oxide-based in-plane magnetized film (Co-22.5Pt)-20.5 vol % WO$_3$ is preferably 20 to 40 nm.

In Comparative Example 7, the thickness of the CoPt-oxide-based in-plane magnetized film (Co-22.5Pt)-20.5 vol % WO$_3$ is 10 nm, and so Comparative Example 7 is not within the scope of the present invention. Comparative Example 7 has remanent magnetization per unit area Mrt of 1.26 memu/cm$^2$, which is less than 2.00 memu/cm$^2$. In Comparative Example 8, the thickness of the CoPt-oxide-based in-plane magnetized film (Co-22.5Pt)-20.5 vol % WO$_3$ is 90 nm, Comparative Example 8 is not within the scope of the present invention. The Comparative Example 8 has a magnetic coercive force Hc of 1.78 kOe, which is less than 2.00 kOe. In Comparative Example 9, the thickness of the CoPt-oxide-based in-plane magnetized film (Co-22.5Pt)-20.5 vol % WO$_3$ is 100 nm, and so Comparative Example 9 is not within the scope of the present invention. Comparative Example 9 has a magnetic coercive force Hc of 1.49 kOe, which is less than 2.00 kOe.

(D) Study about Type of Oxide of CoPt-Oxide-Based In-Plane Magnetized Film (Examples 10 and 18 to 23)

Experimental data was obtained with varying the type of the oxide of a CoPt-oxide-based in-plane magnetized film to be formed on a Ru substrate film. The CoPt-oxide-based in-plane magnetized film to be formed was a single layer, without a nonmagnetic intermediate layer. The details are as follows.

A Ru substrate film was formed on a Si substrate by sputtering so as to have a thickness of 30 nm, and a CoPt-oxide-based in-plane magnetized film was formed thereon by sputtering so as to have a thickness of 30 nm. In this film formation process, room temperature film formation was performed without heating the substrate.

Data was obtained with varying the type of the oxide of the CoPt-oxide-based in-plane magnetized film to be formed. The oxide used included WO$_3$, B$_2$O$_3$, MoO$_3$, Nb$_2$O$_5$, SiO$_2$, Ta$_2$O$_5$, and TiO$_2$.

A hysteresis loop of each of the produced CoPt-oxide-based in-plane magnetized films was measured using a vibrating magnetometer. From the measured hysteresis loop, a magnetic coercive force Hc (kOe) and remanent magnetization Mr (memu/cm$^3$) were read. By multiplying the read remanent magnetization Mr (memu/cm$^3$) by the film thickness 30 nm of the produced CoPt-oxide-based in-plane magnetized film, remanent magnetization per unit area Mrt (memu/cm$^2$) of the produced CoPt-oxide-based in-plane magnetized film was calculated. The results are shown in the following Table 4.

TABLE 4

| | Composition of target | Composition of in-plane magnetized film | Thickness of in-plane magnetized film (nm) | Magnetic coercive force Hc (kOe) | Remanent magnetization per unit area Mrt (memu/cm$^2$) |
|---|---|---|---|---|---|
| Example10 | (Co—20Pt)-30 vol % WO$_3$ | (Co—22.5Pt)-31.0 vol % WO$_3$ | 30 | 4.07 | 2.30 |
| Example18 | (Co—20Pt)-30 vol % B$_2$O$_3$ | (Co—22.5Pt)-30 vol % B$_2$O$_3$ [note] | 30 | 2.54 | 2.61 |
| Example19 | (Co—20Pt)-30 vol % MoO$_3$ | (Co—22.5Pt)-30.9 vol % MoO$_3$ | 30 | 3.55 | 2.01 |
| Example20 | (Co—20Pt)-30 vol % Nb$_2$O$_5$ | (Co—22.5Pt)-30.8 vol % Nb$_2$O$_5$ | 30 | 2.95 | 2.46 |
| Example21 | (Co—20Pt)-30 vol % SiO$_2$ | (Co—22.5Pt)-30.7 vol % SiO$_2$ | 30 | 2.17 | 2.63 |

TABLE 4-continued

|  | Composition of target | Composition of in-plane magnetized film | Thickness of in-plane magnetized film (nm) | Magnetic coercive force Hc (kOe) | Remanent magnetization per unit area Mrt (memu/cm$^2$) |
|---|---|---|---|---|---|
| Example22 | (Co—20Pt)-30 vol % Ta$_2$O$_5$ | (Co—22.5Pt)-31.0 vol % Ta$_2$O$_5$ | 30 | 2.58 | 2.12 |
| Example23 | (Co—20Pt)-30 vol % TiO$_2$ | (Co—22.5Pt)-30.8 vol % TiO$_2$ | 30 | 2.08 | 2.05 |

(note)

As will be described later, since boron (B) is a light element having an atomic number smaller than that of oxygen (O), it cannot be detected by analysis in EDX. Therefore, the exact value of B$_2$O$_3$ content in the in-plane magnetized film of Example 18 is unknown at this time. In Table 4 above, as the value of B$_2$O$_3$ content in the composition of the in-plane magnetized film of Example 18, the value of B$_2$O$_3$ content in the target composition is shown, but it may deviate from the actual value.

As can be seen from Table 4, in Examples 10 and 18 to 23 in which WO$_3$, B$_2$O$_3$, MoO$_3$, Nb$_2$O$_5$, SiO$_2$, Ta$_2$O$_5$, or TiO$_2$ was used as the oxide of the CoPt-oxide-based in-plane magnetized film, the composition is (Co-22.5Pt)-30 to 31 vol % oxide, and the thickness is 30 nm, and so Examples 10 and 18 to 23 are within the scope of the present invention. They achieve magnetic performance of a magnetic coercive force Hc of 2.00 kOe or more and remanent magnetization per unit area Mrt of 2.00 memu/cm$^2$ or more by the room temperature film formation without heating the substrate.

Example 10 in which WO$_3$ was used as the oxide and Example 19 in which MoO$_3$ was used as the oxide have a magnetic coercive force Hc exceeding 3 kOe. Thus, WO$_3$ and MoO$_3$ are preferably used as the oxide in the CoPt-oxide-based in-plane magnetized film.

(E) Study about Multilayering of CoPt-Oxide-Based In-Plane Magnetized Film by Using Nonmagnetic Intermediate Layer (Nonmagnetic Intermediate Layer Produced Using Sputtering Target Made of Single Metal Ru) (Examples 24 to 30)

A nonmagnetic intermediate layer produced using a sputtering target made of single metal Ru (hereinafter also referred to as a metal Ru nonmagnetic intermediate layer) was provided in an intermediate position in the thickness direction of a CoPt-oxide-based in-plane magnetized film formed on a Ru substrate film to multilayer (double the layers) the CoPt-oxide-based in-plane magnetized film, and experimental data was obtained. At this time, the data was obtained with varying the thickness of the metal Ru nonmagnetic intermediate layer to be provided in a range of from 0 nm to 3.0 nm. The details are as follows.

A Ru substrate film was formed on a Si substrate by sputtering so as to have a thickness of 30 nm, and a CoPt-oxide-based in-plane magnetized film was formed thereon by sputtering so as to have a thickness of 30 nm. Thereafter, a metal Ru nonmagnetic intermediate layer was formed thereon by sputtering, and a CoPt-oxide-based in-plane magnetized film was further formed thereon by sputtering so as to have a thickness of 30 nm. In this film formation process, room temperature film formation was performed without heating the substrate.

Samples were produced with varying the thickness of the metal Ru nonmagnetic intermediate layer to 0 nm, 0.3 nm, 0.6 nm, 1.2 nm, 1.8 nm, 2.4 nm, and 3.0 nm, and data was obtained.

Hysteresis loops of the produced multilayer samples were measured using the vibrating magnetometer. From each of the measured hysteresis loops, a magnetic coercive force Hc (kOe) and remanent magnetization per unit volume Mr (memu/cm$^3$) of the in-plane magnetized films included in the multilayer sample were read. By multiplying the remanent magnetization per unit volume Mr (memu/cm$^3$) of the in-plane magnetized films included in the multilayer sample by the total film thickness 60 nm of the in-plane magnetized films included in the produced multilayer sample, remanent magnetization per unit area Mrt (memu/cm$^2$) of the in-plane magnetized films included in the multilayer sample was calculated. The results are shown in the following Table 5. Note that, Example 24 without a nonmagnetic intermediate layer is a reference example to make comparison with Examples 25 to 30, each of which has the plurality of in-plane magnetized films provided across the nonmagnetic intermediate layer.

TABLE 5

|  | Composition of target used for producing nonmagnetic intermediate layer | Thickness of Nonmagnetic Intermediate Layer (nm) | Composition of target used for producing in-plane magnetized film | Composition of in-plane magnetized film |
|---|---|---|---|---|
| Example 24 | — | — | (Co—20Pt)-30 vol % WO$_3$ | (Co—22.5Pt)-31.0 vol % WO$_3$ |
| Example 25 | 100Ru | 0.3 | (Co—20Pt)-30 vol % WO$_3$ | (Co—22.5Pt)-31.0 vol % WO$_3$ |
| Example 26 | 100Ru | 0.6 | (Co—20Pt)-30 vol % WO$_3$ | (Co—22.5Pt)-31.0 vol % WO$_3$ |
| Example 27 | 100Ru | 1.2 | (Co—20Pt)-30 vol % WO$_3$ | (Co—22.5Pt)-31.0 vol % WO$_3$ |
| Example 28 | 100Ru | 1.8 | (Co—20Pt)-30 vol % WO$_3$ | (Co—22.5Pt)-31.0 vol % WO$_3$ |
| Example 29 | 100Ru | 2.4 | (Co—20Pt)-30 vol % WO$_3$ | (Co—22.5Pt)-31.0 vol % WO$_3$ |
| Example 30 | 100Ru | 3.0 | (Co—20Pt)-30 vol % WO$_3$ | (Co—22.5Pt)-31.0 vol % WO$_3$ |

TABLE 5-continued

|  | Thickness of in-plane magnetized film (nm) | | Magnetic coercive force Hc (kOe) | Remanent magnetization per unit area Mrt (memu/cm$^2$) |
|---|---|---|---|---|
|  | Total thickness | Thickness of one layer | | |
| Example 24 | 60 | 60 | 2.36 | 4.18 |
| Example 25 | 60 | 30 | 2.75 | 4.31 |
| Example 26 | 60 | 30 | 2.74 | 4.18 |
| Example 27 | 60 | 30 | 2.71 | 4.20 |
| Example 28 | 60 | 30 | 2.75 | 4.20 |
| Example 29 | 60 | 30 | 2.78 | 4.23 |
| Example 30 | 60 | 30 | 2.93 | 4.14 |

As can be seen from Table 5, all of Examples 25 to 30 having the plurality of in-plane magnetized films provided across the metal Ru nonmagnetic intermediate layer have an increased magnetic coercive force Hc by about 15% or more, as compared to Example 24 in which the in-plane magnetized film is a single layer without a nonmagnetic intermediate layer. In contrast, the remanent magnetization per unit area Mrt (memu/cm$^2$) is approximately the same as that of Example 24 (having the in-plane magnetized film of the single layer).

Therefore, it is conceivable that providing the plurality of CoPt-oxide-based in-plane magnetized films across the metal Ru nonmagnetic intermediate layer allows for increasing the magnetic coercive force Hc by about 15% or more, while maintaining the remanent magnetization Mrt (memu/cm$^2$) per unit area.

In Examples 25 to 30 in each of which the plurality of in-plane magnetized films are provided across the metal Ru nonmagnetic intermediate layer, although the thickness of the metal Ru nonmagnetic intermediate layer varies in a range of 0.3 to 3.0 nm, the magnetic coercive force Hc (kOe) and the remanent magnetization per unit area Mrt (memu/cm$^2$) are approximately the same.

Accordingly, it is conceivable that the metal Ru nonmagnetic intermediate layer has approximately the same effects (effects in terms of the magnetic coercive force He and the remanent magnetization Mrt) on the CoPt-oxide-based in-plane magnetized films stacked in layers, as long as the thickness of the metal Ru nonmagnetic intermediate layer is in the range of 0.3 to 3.0 nm.

(F) Study about Multilayering of CoPt-Oxide-Based In-Plane Magnetized Film Using Nonmagnetic Intermediate Layer (Ru Alloy Layer) (Examples 24 and 31 to 36)

A nonmagnetic intermediate layer produced using a sputtering target made of a Ru alloy (Ru-25Cr-25Co) (hereinafter also referred to as a Ru alloy nonmagnetic intermediate layer) was provided in an intermediate position in the thickness direction of a CoPt-oxide-based in-plane magnetized film formed on a Ru substrate film to multilayer (double the layers) the CoPt-oxide-based in-plane magnetized film, and experimental data was obtained. At this time, the data was obtained with varying the thickness of the Ru alloy nonmagnetic intermediate layer to be provided in a range of from 0 nm to 3.0 nm. The details are as follows.

A Ru substrate film was formed on a Si substrate by sputtering so as to have a thickness of 30 nm, and a CoPt-oxide-based in-plane magnetized film was formed thereon by sputtering so as to have a thickness of 30 nm. Thereafter, a Ru alloy nonmagnetic intermediate layer was formed thereon by sputtering, and a CoPt-oxide-based in-plane magnetized film was further formed thereon by sputtering so as to have a thickness of 30 nm. In this film formation process, room temperature film formation was performed without heating the substrate.

Samples were produced with varying the thickness of the Ru alloy nonmagnetic intermediate layer to 0 nm, 0.3 nm, 0.6 nm, 1.2 nm, 1.8 nm, 2.4 nm, and 3.0 nm, and data was obtained.

Hysteresis loops of the produced multilayer samples were measured using the vibrating magnetometer. From each of the measured hysteresis loops, a magnetic coercive force Hc (kOe) and remanent magnetization per unit volume Mr (memu/cm$^3$) of the in-plane magnetized films included in the multilayer sample were read. By multiplying the remanent magnetization per unit volume Mr (memu/cm$^3$) of the in-plane magnetized films included in the multilayer sample by the total film thickness 60 nm of the in-plane magnetized films included in the produced multilayer sample, remanent magnetization per unit area Mrt (memu/cm$^2$) of the in-plane magnetized films included in the multilayer sample was calculated. The results are shown in the following Table 6. Note that, Example 24 without a nonmagnetic intermediate layer is a reference example to make comparison with Examples 31 to 36, each of which has the plurality of in-plane magnetized films provided across the nonmagnetic intermediate layer.

TABLE 6

| | Composition of target used for producing nonmagnetic intermediate layer | Thickness of nonmagnetic intermediate layer (nm) | Composition of target used for producing in-plane magnetized film | Composition of in-plane magnetized film |
|---|---|---|---|---|
| Example 24 | — | — | (Co—20Pt)-30 vol % WO$_3$ | (Co—22.5Pt)-31.0 vol % WO$_3$ |
| Example 31 | Ru—25Cr—25Co | 0.3 | (Co—20Pt)-30 vol % WO$_3$ | (Co—22.5Pt)-31.0 vol % WO$_3$ |
| Example 32 | Ru—25Cr—25Co | 0.6 | (Co—20Pt)-30 vol % WO$_3$ | (Co—22.5Pt)-31.0 vol % WO$_3$ |

TABLE 6-continued

| Example 33 | Ru—25Cr—25Co | 1.2 | (Co—20Pt)-30 vol % $WO_3$ | (Co—22.5Pt)-31.0 vol % $WO_3$ |
| Example 34 | Ru—25Cr—25Co | 1.8 | (Co—20Pt)-30 vol % $WO_3$ | (Co—22.5Pt)-31.0 vol % $WO_3$ |
| Example 35 | Ru—25Cr—25Co | 2.4 | (Co—20Pt)-30 vol % $WO_3$ | (Co—22.5Pt)-31.0 vol % $WO_3$ |
| Example 36 | Ru—25Cr—25Co | 3.0 | (Co—20Pt)-30 vol % $WO_3$ | (Co—22.5Pt)-31.0 vol % $WO_3$ |

| | Thickness of in-plane magnetized film (nm) | | Magnetic coercive force Hc (kOe) | Remanent magnetization per unit area Mrt (memu/cm$^2$) |
| --- | --- | --- | --- | --- |
| | Total thickness | Thickness of one layer | | |
| Example 24 | 60 | 60 | 2.36 | 4.18 |
| Example 31 | 60 | 30 | 2.72 | 4.31 |
| Example 32 | 60 | 30 | 2.65 | 4.20 |
| Example 33 | 60 | 30 | 2.63 | 4.21 |
| Example 34 | 60 | 30 | 2.73 | 4.14 |
| Example 35 | 60 | 30 | 2.75 | 4.25 |
| Example 36 | 60 | 30 | 2.89 | 4.12 |

As can be seen from Table 6, all of Examples 31 to 36 having the plurality of in-plane magnetized films provided across the Ru alloy nonmagnetic intermediate layer have an increased magnetic coercive force Hc by about 11% or more, as compared to Example 24 in which the in-plane magnetized film is a single layer without a nonmagnetic intermediate layer. In contrast, the remanent magnetization per unit area Mrt (memu/cm$^2$) is approximately the same as that of Example 24 (having the in-plane magnetized film of the single layer).

Therefore, it is conceivable that providing the plurality of CoPt-oxide-based in-plane magnetized films across the Ru alloy nonmagnetic intermediate layer allows for increasing the magnetic coercive force Hc by about 11% or more, while maintaining the remanent magnetization Mrt (memu/cm$^2$) per unit area.

In Examples 31 to 36 in each of which the plurality of in-plane magnetized films are provided across the Ru alloy nonmagnetic intermediate layer, although the thickness of the Ru alloy nonmagnetic intermediate layer varies in a range of 0.3 to 3.0 nm, the magnetic coercive force Hc (kOe) and the remanent magnetization per unit area Mrt (memu/cm$^2$) are approximately the same.

Accordingly, it is conceivable that the Ru alloy nonmagnetic intermediate layer has approximately the same effects (effects in terms of the magnetic coercive force He and the remanent magnetization Mrt) on the CoPt-oxide-based in-plane magnetized films stacked in layers, as long as the thickness of the metal Ru nonmagnetic intermediate layer is in the range of 0.3 to 3.0 nm.

Although the difference between the magnetic coercive force Hc of Examples 25 to 30 in which the nonmagnetic intermediate layer is the metal Ru nonmagnetic intermediate layer and the magnetic coercive force Hc of Examples 31 to 36 in which the nonmagnetic intermediate layer is the Ru alloy nonmagnetic intermediate layer is slight, it is readable from Tables 5 and 6 that the magnetic coercive force Hc of Examples 25 to 30 in which the nonmagnetic intermediate layer is the metal Ru nonmagnetic intermediate layer is larger than the other. Thus, it is conceivable that the metal Ru nonmagnetic intermediate layer is more suitable than the Ru alloy nonmagnetic intermediate layer as the nonmagnetic intermediate layer.

(G) Study about Multilayering of CoPt-Oxide-Based In-Plane Magnetized Film Using Nonmagnetic Intermediate Layer (Nonmagnetic Intermediate Layer Produced Using Sputtering Target Made of Single Metal Cr) (Example 24 and Comparative Examples 10 to 15)

A nonmagnetic intermediate layer produced using a sputtering target made of single metal Cr (hereinafter also referred to as a metal Cr nonmagnetic intermediate layer) was provided in an intermediate position in the thickness direction of a CoPt-oxide-based in-plane magnetized film formed on a Ru substrate film to multilayer (double the layers) the CoPt-oxide-based in-plane magnetized film, and experimental data was obtained. At this time, the data was obtained with varying the thickness of the nonmagnetic intermediate layer to be provided in a range of from 0 nm to 3.0 nm. The details are as follows.

A Ru substrate film was formed on a Si substrate by sputtering so as to have a thickness of 30 nm, and a CoPt-oxide-based in-plane magnetized film was formed thereon by sputtering so as to have a thickness of 30 nm. Thereafter, a metal Cr nonmagnetic intermediate layer was formed thereon, and a CoPt-oxide-based in-plane magnetized film was further formed thereon by sputtering so as to have a thickness of 30 nm. In this film formation process, room temperature film formation was performed without heating the substrate.

Samples were produced with varying the thickness of the metal Cr nonmagnetic intermediate layer to 0 nm, 0.3 nm, 0.6 nm, 1.2 nm, 1.8 nm, 2.4 nm, and 3.0 nm, and data was obtained.

Hysteresis loops of the produced multilayer samples were measured using the vibrating magnetometer. From each of the measured hysteresis loops, a magnetic coercive force Hc (kOe) and remanent magnetization per unit volume Mr (memu/cm$^3$) of the in-plane magnetized films included in the multilayer sample were read. By multiplying the remanent magnetization per unit volume Mr (memu/cm$^3$) of the in-plane magnetized films included in the multilayer sample by the total film thickness 60 nm of the in-plane magnetized films included in the produced multilayer sample, remanent magnetization per unit area Mrt (memu/cm$^2$) of the in-plane magnetized films included in the multilayer sample was calculated. The results are shown in the following Table 7. Note that Example 24 without a nonmagnetic intermediate layer is a reference example to make comparison with Comparative Examples 10 to 15, each of which has the plurality of in-plane magnetized films provided across the nonmagnetic intermediate layer.

Accordingly, it is conceivable that the metal Cr nonmagnetic intermediate layer has approximately the same effects (effects in terms of the magnetic coercive force Hc and the remanent magnetization Mrt) on the CoPt-oxide-based in-

TABLE 7

| | Composition of target used for producing nonmagnetic intermediate layer | Thickness of nonmagnetic intermediate layer (nm) | Composition of target used for producing in-plane magnetized film | Composition of in-plane magnetized film |
|---|---|---|---|---|
| Example 24 | — | — | (Co—20Pt)-30 vol % $WO_3$ | (Co—22.5Pt)-31.0 vol % $WO_3$ |
| Comparative Example 10 | 100Cr | 0.3 | (Co—20Pt)-30 vol % $WO_3$ | (Co—22.5Pt)-31.0 vol % $WO_3$ |
| Comparative Example 11 | 100Cr | 0.6 | (Co—20Pt)-30 vol % $WO_3$ | (Co—22.5Pt)-31.0 vol % $WO_3$ |
| Comparative Example 12 | 100Cr | 1.2 | (Co—20Pt)-30 vol % $WO_3$ | (Co—22.5Pt)-31.0 vol % $WO_3$ |
| Comparative Example 13 | 100Cr | 1.8 | (Co—20Pt)-30 vol % $WO_3$ | (Co—22.5Pt)-31.0 vol % $WO_3$ |
| Comparative Example 14 | 100Cr | 2.4 | (Co—20Pt)-30 vol % $WO_3$ | (Co—22.5Pt)-31.0 vol % $WO_3$ |
| Comparative Example 15 | 100Cr | 3.0 | (Co—20Pt)-30 vol % $WO_3$ | (Co—22.5Pt)-31.0 vol % $WO_3$ |

| | Thickness of in-plane magnetized film (nm) | | Magnetic coercive force Hc (kOe) | Remanent magnetization per unit area Mrt (memu/cm$^2$) |
|---|---|---|---|---|
| | Total thickness | Thickness of one layer | | |
| Example 24 | 60 | 60 | 2.36 | 4.18 |
| Comparative Example 10 | 60 | 30 | 1.02 | 6.23 |
| Comparative Example 11 | 60 | 30 | 1.00 | 6.45 |
| Comparative Example 12 | 60 | 30 | 0.99 | 6.27 |
| Comparative Example 13 | 60 | 30 | 1.07 | 6.25 |
| Comparative Example 14 | 60 | 30 | 1.00 | 6.43 |
| Comparative Example 15 | 60 | 30 | 1.03 | 6.23 |

As can be seen from Table 7, all of Comparative Examples 10 to 15 having the plurality of in-plane magnetized films provided across the metal Cr nonmagnetic intermediate layer have a reduced magnetic coercive force Hc by about 50% or more, as compared to Example 24 in which the in-plane magnetized film is a single layer without a nonmagnetic intermediate layer. In contrast, the remanent magnetization per unit area Mrt (memu/cm$^2$) is increased by about 49% or more as compared to Example 24 (having the in-plane magnetized film of the single layer).

Therefore, it is conceivable that providing the plurality of CoPt-oxide-based in-plane magnetized films across the metal Cr nonmagnetic intermediate layer allows for increasing the remanent magnetization per unit area Mrt (memu/cm$^2$) by about 49% or more while reducing the magnetic coercive force Hc by 50% or more.

In Comparative Examples 10 to 15 in each of which the plurality of in-plane magnetized films are provided across the metal Cr nonmagnetic intermediate layer, although the thickness of the metal Cr nonmagnetic intermediate layer varies in a range of 0.3 to 3.0 nm, the magnetic coercive force Hc (kOe) and the remanent magnetization per unit area Mrt (memu/cm$^2$) are approximately the same.

plane magnetized films stacked in layers, as long as the thickness of the metal Cr nonmagnetic intermediate layer is in the range of 0.3 to 3.0 nm.

As described above, when the plurality of CoPt-oxide-based in-plane magnetized films are provided across the metal Ru nonmagnetic intermediate layer, as shown in Examples 25 to 30, the magnetic coercive force Hc is increased by about 15% or more, as compared to Example 24 (in which the in-plane magnetized film is the single layer). When the plurality of CoPt-oxide-based in-plane magnetized films are provided across the Ru alloy nonmagnetic intermediate layer, as shown in Examples 31 to 36, the magnetic coercive force Hc is increased by about 11% or more, as compared to Example 24 (in which the in-plane magnetized film is the single layer). However, when the plurality of CoPt-oxide-based in-plane magnetized films are provided across the metal Cr nonmagnetic intermediate layer, as shown in Comparative Examples 10 to 15, the magnetic coercive force Hc is reduced by 50% or more, as compared to Example 24 (in which the in-plane magnetized film is the single layer). It is conceivable that this is because although the crystal structure of metal Ru and a Ru-25Cr-25Co alloy is hexagonal closest packed structure hcp, which is the same as the crystal structure of magnetic grains (CoPt alloy grains) of the CoPt-oxide-based in-plane magnetized films, the crystal structure of metal Cr is body-centered cubic structure bcc.

(H) Study about Thickness of One In-Plane Magnetized Film in Multilayered CoPt-Oxide-Based In-Plane Magnetized Films Provided Across Nonmagnetic Intermediate Layer/Layers (Single Metal Ru Layer/Layers) (Examples 24 and 37 to 40)

A CoPt-oxide-based in-plane magnetized film formed on a Ru substrate film was multilayered by providing one or more metal Ru nonmagnetic intermediate layers having a thickness of 2.0 nm in such positions as to divide the CoPt-oxide-based in-plane magnetized film into 2 equal parts, 4 equal parts, 6 equal parts, and 12 equal parts in a thickness direction, and in such a manner as to have a total thickness of the CoPt-oxide-based in-plane magnetized film of 60 nm, and experimental data was obtained. The details are as follows.

A Ru substrate film was formed on a Si substrate by sputtering so as to have a thickness of 30 nm, and a CoPt-oxide-based in-plane magnetized film was formed thereon by sputtering so as to have a thickness of 30 nm. Thereafter, a metal Ru nonmagnetic intermediate layer having a thickness of 2.0 nm was formed thereon by sputtering, and a CoPt-oxide-based in-plane magnetized film was further formed thereon by sputtering so as to have a thickness of 30 nm. As a result, the CoPt-oxide-based in-plane magnetized film was formed to have a total thickness of 60 nm (Example 37).

A multilayer sample in which 15 nm-thick CoPt-oxide-based in-plane magnetized films were stacked in 4 layers was produced (Example 38), by forming a Ru substrate film on a Si substrate by sputtering so as to have a thickness of 30 nm, forming a CoPt-oxide-based in-plane magnetized film thereon by sputtering so as to have a thickness of 15 nm, thereafter forming a metal Ru nonmagnetic intermediate layer having a thickness of 2.0 nm thereon by sputtering, forming a CoPt-oxide-based in-plane magnetized film thereon by sputtering so as to have a thickness of 15 nm, thereafter forming a metal Ru nonmagnetic intermediate layer having a thickness of 2.0 nm thereon by sputtering, and repeating the formation of the films in the same manner until the total thickness of the CoPt-oxide-based in-plane magnetized films was 60 nm.

A multilayer sample in which 10 nm-thick CoPt-oxide-based in-plane magnetized films were stacked in 6 layers was produced (Example 39), by forming a Ru substrate film on a Si substrate by sputtering so as to have a thickness of 30 nm, forming a CoPt-oxide-based in-plane magnetized film thereon by sputtering so as to have a thickness of 10 nm, thereafter forming a metal Ru nonmagnetic intermediate layer having a thickness of 2.0 nm thereon by sputtering, forming a CoPt-oxide-based in-plane magnetized film thereon by sputtering so as to have a thickness of 10 nm, thereafter forming a metal Ru nonmagnetic intermediate layer having a thickness of 2.0 nm thereon by sputtering, and repeating the formation of the films in the same manner until the total thickness of the CoPt-oxide-based in-plane magnetized films was 60 nm.

A multilayer sample in which 5 nm-thick CoPt-oxide-based in-plane magnetized films were stacked in 12 layers was produced (Example 40), by forming a Ru substrate film on a Si substrate by sputtering so as to have a thickness of 30 nm, forming a CoPt-oxide-based in-plane magnetized film thereon by sputtering so as to have a thickness of 5 nm, thereafter forming a metal Ru nonmagnetic intermediate layer having a thickness of 2.0 nm thereon by sputtering, forming a CoPt-oxide-based in-plane magnetized film thereon by sputtering so as to have a thickness of 5 nm, thereafter forming a metal Ru nonmagnetic intermediate layer having a thickness of 2.0 nm thereon by sputtering, and repeating the formation of the films in the same manner until the total thickness of the CoPt-oxide-based in-plane magnetized films was 60 nm.

In this film formation process, room temperature film formation was performed without heating the substrate.

Hysteresis loops of the produced multilayer samples were measured using the vibrating magnetometer. From each of the measured hysteresis loops, a magnetic coercive force Hc (kOe) and remanent magnetization per unit volume Mr (memu/cm$^3$) of the in-plane magnetized films included in the multilayer sample were read. By multiplying the remanent magnetization per unit volume Mr (memu/cm$^3$) of the in-plane magnetized films included in the multilayer sample by the total film thickness 60 nm of the in-plane magnetized films included in the produced multilayer sample, remanent magnetization per unit area Mrt (memu/cm$^2$) of the in-plane magnetized films included in the multilayer sample was calculated. The results are shown in the following Table 8. Note that Example 24 without a nonmagnetic intermediate layer is a reference example to make comparison with Examples 37 to 40, each of which has the plurality of in-plane magnetized films provided across the nonmagnetic intermediate layer/layers.

TABLE 8

| | Composition of target used for producing nonmagnetic intermediate layer | Thickness of nonmagnetic intermediate layer (nm) | Composition of target used for producing in-plane magnetized film | Composition of in-plane magnetized film |
|---|---|---|---|---|
| Example 24 | — | — | (Co—20Pt)-30 vol % WO$_3$ | (Co—22.5Pt)-31.0 vol % WO$_3$ |
| Example 37 | 100Ru | 2.0 | (Co—20Pt)-30 vol % WO$_3$ | (Co—22.5Pt)-31.0 vol % WO$_3$ |
| Example 38 | 100Ru | 2.0 | (Co—20Pt)-30 vol % WO$_3$ | (Co—22.5Pt)-31.0 vol % WO$_3$ |
| Example 39 | 100Ru | 2.0 | (Co—20Pt)-30 vol % WO$_3$ | (Co—22.5Pt)-31.0 vol % WO$_3$ |
| Example 40 | 100Ru | 2.0 | (Co—20Pt)-30 vol % WO$_3$ | (Co—22.5Pt)-31.0 vol % WO$_3$ |

TABLE 8-continued

| | Thickness of in-plane magnetized film (nm) | | Magnetic coercive force Hc (kOe) | Remanent magnetization per unit area Mrt (memu/cm$^2$) |
|---|---|---|---|---|
| | Total thickness | Thickness of one layer | | |
| Example 24 | 60 | 60 | 2.36 | 4.18 |
| Example 37 | 60 | 30 | 2.76 | 4.19 |
| Example 38 | 60 | 15 | 3.66 | 4.14 |
| Example 39 | 60 | 10 | 3.04 | 4.13 |
| Example 40 | 60 | 5 | 2.68 | 4.07 |

As can be seen from Table 8, all of Examples 37 to 40 having the plurality of in-plane magnetized films provided across the metal Ru nonmagnetic intermediate layer have an increased magnetic coercive force Hc by about 13% or more, as compared to Example 24 in which the in-plane magnetized film is a single layer without a nonmagnetic intermediate layer. In contrast, the remanent magnetization per unit area Mrt (memu/cm$^2$) is approximately the same as that of Example 24 (having the in-plane magnetized film of the single layer).

Therefore, it is conceivable that providing the plurality of CoPt-oxide-based in-plane magnetized films across the metal Ru nonmagnetic intermediate layer allows for increasing the magnetic coercive force Hc by about 13% or more, while maintaining the remanent magnetization per unit area Mrt (memu/cm$^2$).

The magnetic coercive force Hc of Example 38 in which the in-plane magnetized films each having a thickness of 15 nm are stacked in 4 layers is 3.66 kOe, and hence increased by about 55% as compared to Example 24 in which the in-plane magnetized film is a single layer without a nonmagnetic intermediate layer.

The magnetic coercive force Hc of Example 39 in which the in-plane magnetized films each having a thickness of 10 nm are stacked in 6 layers is 3.04 kOe, and hence increased by about 29% as compared to Example 24 in which the in-plane magnetized film is a single layer without a nonmagnetic intermediate layer.

The magnetic coercive force Hc of Example 37 in which the in-plane magnetized films each having a thickness of 30 nm are stacked in 2 layers is 2.76 kOe, and hence increased by about 17% as compared to Example 24 in which the in-plane magnetized film is a single layer without a nonmagnetic intermediate layer.

The magnetic coercive force Hc of Example 40 in which the in-plane magnetized films each having a thickness of 5 nm are stacked in 12 layers is 2.68 kOe, and hence increased by about 14% as compared to Example 24 in which the in-plane magnetized film is a single layer without a nonmagnetic intermediate layer.

Therefore, when the plurality of the in-plane magnetized films are in layers, the thickness of a single layer is preferably 5 to 30 nm, more preferably 7.5 to 25 nm, and particularly preferably 10 to 20 nm. However, this is on the precondition that the total thickness of the in-plane magnetized films is 20 nm or more, because, as can be seen from results of Examples 9 and 12 to 17 and Comparative Example 7, when the total thickness (total of thicknesses) of the in-plane magnetized films is less than 20 nm, the value of the remanent magnetization per unit area Mrt falls below 2.00 memu/cm$^2$.

(I) Additional Study about Thickness of One In-Plane Magnetized Film in Multilayered CoPt-Oxide-Based In-Plane Magnetized Films Provided Across Nonmagnetic Intermediate Layer/Layers (Single Metal Ru Layer/Layers) and Study about Total Thickness of In-Plane Magnetized Film in In-Plane Magnetized Film Multilayer Structure (Examples 41 to 53 and Comparative Examples 16 and 17)

As described in previous paragraphs, when a plurality of in-plane magnetized films are in layers, the thickness of a single layer is preferably 5 to 30 nm, more preferably 7.5 to 25 nm, and particularly preferably 10 to 20 nm from the viewpoint of a magnetic coercive force Hc. For further study of this point, the thickness of one in-plane magnetized film in multilayered CoPt-oxide-based in-plane magnetized films provided across a metal Ru nonmagnetic intermediate layer was additionally studied. In-plane magnetized film multilayer structures having a total thickness of in-plane magnetized films of 30 nm and 100 nm were also studied, because the study about the in-plane magnetized film structure described in the above-described (H) has only the examples that have a total thickness of the in-plane magnetized films of 60 nm. In the in-plane magnetized film structure having a total thickness of the in-plane magnetized films of 100 nm, cases in which the content of an oxide (WO$_3$) in the in-plane magnetized films was 31.0 vol % and 10.1 vol % were studied.

Each in-plane magnetized film structure was produced by providing a metal Ru nonmagnetic intermediate layer having a thickness of 2.0 nm as a nonmagnetic intermediate layer in the same manner as that in the above-described (H). In this film formation process, room temperature film formation was performed without heating the substrate in the same manner as that in the above-described (H).

A concrete procedure for producing each in-plane magnetized film structure was the same as that in the above-described (H). The magnetic coercive force Hc (kOe) of in-plane magnetized films included in multilayer samples and remanent magnetization Mrt (memu/cm$^2$) per unit area of the in-plane magnetized films included in the multilayer samples were measured in the same manner as that in the above-described (H).

Measurement results thereof are shown in the following Tables 9 to 11. Table 9 shows measurement results in a case where the total thickness of the in-plane magnetized films is 30 nm. Table 10 shows measurement results in a case where the total thickness of the in-plane magnetized films is 100 nm and the content of the oxide (WO$_3$) in the in-plane magnetized films is 31.0 vol %. Table 11 shows measurement results in a case where the total thickness of the in-plane magnetized films is 100 nm and the content of the oxide (WO$_3$) in the in-plane magnetized films is 10.1 vol %.

TABLE 9

| | Composition of target used for producing nonmagnetic intermediate layer | Thickness of nonmagnetic intermediate layer (nm) | Composition of target used for producing in-plane magnetized film | Composition of in-plane magnetized film |
|---|---|---|---|---|
| Example 10 | — | — | (Co—20Pt)-30 vol % $WO_3$ | (Co—22.5Pt)-31.0 vol % $WO_3$ |
| Example 41 | 100Ru | 2.0 | (Co—20Pt)-30 vol % $WO_3$ | (Co—22.5Pt)-31.0 vol % $WO_3$ |
| Example 42 | 100Ru | 2.0 | (Co—20Pt)-30 vol % $WO_3$ | (Co—22.5Pt)-31.0 vol % $WO_3$ |
| Example 43 | 100Ru | 2.0 | (Co—20Pt)-30 vol % $WO_3$ | (Co—22.5Pt)-31.0 vol % $WO_3$ |

| | Thickness of in-plane magnetized film (nm) | | Magnetic coercive force Hc (kOe) | Remanent magnetization per unit area Mrt (memu/cm$^2$) |
|---|---|---|---|---|
| | Total thickness | Thickness of one layer | | |
| Example 10 | 30 | 30 | 4.07 | 2.30 |
| Example 41 | 30 | 15 | 4.53 | 2.28 |
| Example 42 | 30 | 10 | 4.41 | 2.25 |
| Example 43 | 30 | 5 | 4.22 | 2.26 |

TABLE 10

| | Composition of target used for producing nonmagnetic intermediate layer | Thickness of nonmagnetic intermediate layer (nm) | Composition of target used for producing in-plane magnetized film | Composition of in-plane magnetized film |
|---|---|---|---|---|
| Comparative Example 16 | — | — | (Co—20Pt)-30 vol % $WO_3$ | (Co—22.5Pt)-31.0 vol % $WO_3$ |
| Example 44 | 100Ru | 2.0 | (Co—20Pt)-30 vol % $WO_3$ | (Co—22.5Pt)-31.0 vol % $WO_3$ |
| Example 45 | 100Ru | 2.0 | (Co—20Pt)-30 vol % $WO_3$ | (Co—22.5Pt)-31.0 vol % $WO_3$ |
| Example 46 | 100Ru | 2.0 | (Co—20Pt)-30 vol % $WO_3$ | (Co—22.5Pt)-31.0 vol % $WO_3$ |
| Example 47 | 100Ru | 2.0 | (Co—20Pt)-30 vol % $WO_3$ | (Co—22.5Pt)-31.0 vol % $WO_3$ |
| Example 48 | 100Ru | 2.0 | (Co—20Pt)-30 vol % $WO_3$ | (Co—22.5Pt)-31.0 vol % $WO_3$ |

| | Thickness of in-plane magnetized film (nm) | | Magnetic coercive force Hc (kOe) | Remanent magnetization per unit area Mrt (memu/cm$^2$) |
|---|---|---|---|---|
| | Total thickness | Thickness of one layer | | |
| Comparative Example 16 | 100 | 100 | 1.34 | 6.91 |
| Example 44 | 100 | 50 | 2.81 | 6.94 |
| Example 45 | 100 | 25 | 3.47 | 6.76 |
| Example 46 | 100 | 12.5 | 3.67 | 6.78 |
| Example 47 | 100 | 10 | 3.63 | 6.53 |
| Example 48 | 100 | 5 | 2.93 | 6.12 |

TABLE 11

| | Composition of target used for producing nonmagnetic intermediate layer | Thickness of nonmagnetic intermediate layer (nm) | Composition of target used for producing in-plane magnetized film | Composition of in-plane magnetized film |
|---|---|---|---|---|
| Comparative Example 17 | — | — | (Co—30Pt)-10 vol % $WO_3$ | (Co—33.7Pt)-10.1 vol % $WO_3$ |
| Example 49 | 100Ru | 2.0 | (Co—30Pt)-10 vol % $WO_3$ | (Co—33.7Pt)-10.1 vol % $WO_3$ |

TABLE 11-continued

| | | | | |
|---|---|---|---|---|
| Example 50 | 100Ru | 2.0 | (Co—30Pt)-10 vol % $WO_3$ | (Co—33.7Pt)-10.1 vol % $WO_3$ |
| Example 51 | 100Ru | 2.0 | (Co—30Pt)-10 vol % $WO_3$ | (Co—33.7Pt)-10.1 vol % $WO_3$ |
| Example 52 | 100Ru | 2.0 | (Co—30Pt)-10 vol % $WO_3$ | (Co—33.7Pt)-10.1 vol % $WO_3$ |
| Example 53 | 100Ru | 2.0 | (Co—30Pt)-10 vol % $WO_3$ | (Co—33.7Pt)-10.1 vol % $WO_3$ |

| | Thickness of in-plane magnetized film (nm) | | Magnetic coercive force Hc (kOe) | Remanent magnetization per unit area Mrt (memu/cm$^2$) |
|---|---|---|---|---|
| | Total thickness | Thickness of one layer | | |
| Comparative Example 17 | 100 | 100 | 1.91 | 9.05 |
| Example 49 | 100 | 50 | 4.48 | 8.97 |
| Example 50 | 100 | 25 | 5.26 | 8.88 |
| Example 51 | 100 | 12.5 | 5.80 | 8.50 |
| Example 52 | 100 | 10 | 5.72 | 8.31 |
| Example 53 | 100 | 5 | 5.25 | 8.00 |

As can be seen from Table 9, in Examples 41 to 43 having the plurality of in-plane magnetized films provided across the metal Ru nonmagnetic intermediate layer/layers (total thickness of the in-plane magnetized films is 30 nm), the magnetic coercive force Hc is increased by about 3 to 11%, as compared to Example 10 in which the in-plane magnetized film is a single layer without a nonmagnetic intermediate layer. In contrast, the remanent magnetization per unit area Mrt is approximately the same as that of Example 10 (having the in-plane magnetized film of the single layer).

Therefore, when the thickness of the CoPt-oxide-based in-plane magnetized films is 30 nm, it is conceivable that multilayering using the metal Ru nonmagnetic intermediate layer/layers allows for increasing the magnetic coercive force Hc by about 3 to 11%, while maintaining the remanent magnetization per unit area Mrt.

As can be seen from Table 10, in Examples 44 to 48 having the plurality of in-plane magnetized films provided across the metal Ru nonmagnetic intermediate layer/layers (total thickness of the in-plane magnetized films is 100 nm and the content of the oxide ($WO_3$) in the in-plane magnetized films is 31.0 vol %), the magnetic coercive force Hc is twice or more than that of Comparative Example 16 in which the in-plane magnetized film is a single layer without a nonmagnetic intermediate layer. In contrast, the remanent magnetization per unit area Mrt is approximately the same as or less by about at most 12% than Comparative Example 16 (having the in-plane magnetized film of the single layer).

Therefore, when the thickness of the CoPt-oxide-based in-plane magnetized films is 100 nm and the content of the oxide ($WO_3$) therein is 31.0 vol %, it is conceivable that multilayering by using the metal Ru nonmagnetic intermediate layer/layers doubles the magnetic coercive force Hc or more, while maintaining the remanent magnetization per unit area Mrt.

As can be seen from Table 11, in Examples 49 to 53 having the plurality of in-plane magnetized films provided across the metal Ru nonmagnetic intermediate layer (total thickness of the in-plane magnetized films is 100 nm and the content of the oxide ($WO_3$) in the in-plane magnetized films is 10.1 vol %), the magnetic coercive force Hc is twice or more than that of Comparative Example 17 in which the in-plane magnetized film is a single layer without a nonmagnetic intermediate layer. In contrast, the remanent magnetization per unit area Mrt is approximately the same as or less by about at most 12% than Comparative Example 17 (having the in-plane magnetized film of the single layer).

Therefore, when the thickness of the CoPt-oxide-based in-plane magnetized films is 100 nm and the content of the oxide ($WO_3$) therein is 10.1 vol %, it is conceivable that multilayering by using the metal Ru nonmagnetic intermediate layer/layers doubles the magnetic coercive force Hc or more, while maintaining the remanent magnetization per unit area Mrt.

All of Examples 41 to 43, in which the total thickness of the in-plane magnetized films is 30 nm, are good in terms of increasing the magnetic coercive force while maintaining the remanent magnetization per unit area Mrt (memu/cm$^2$). Among them, Example 41 (having a thickness of one in-plane magnetized film of 15 nm) and Example 42 (having a thickness of one in-plane magnetized film of 10 nm) are particularly good.

All of Examples 44 to 48, in which the total thickness of the in-plane magnetized films is 100 nm and the content of the oxide ($WO_3$) thereof is 31.0 vol %, are good in terms of increasing the magnetic coercive force while maintaining the remanent magnetization per unit area Mrt (memu/cm$^2$). Among them, Example 45 (having a thickness of one in-plane magnetized film of 25 nm), Example 46 (having a thickness of one in-plane magnetized film of 12.5 nm), and Example 47 (having a thickness of one in-plane magnetized film of 10 nm) are more good, and Example 46 and Example 47 are particularly good.

All of Examples 49 to 53, in which the total thickness of the in-plane magnetized films is 100 nm and the content of the oxide ($WO_3$) thereof is 10.1 vol %, are good in terms of increasing the magnetic coercive force while maintaining the remanent magnetization per unit area Mrt (memu/cm$^2$). Among them, Example 50 (having a thickness of one in-plane magnetized film of 25 nm), Example 51 (having a thickness of one in-plane magnetized film of 12.5 nm), and Example 52 (having a thickness of one in-plane magnetized film of 10 nm) are more good, and Example 51 and Example 52 are particularly good.

Therefore, the feature of "when a plurality of the in-plane magnetized films are in layers, the thickness of a single layer is preferably 5 to 30 nm, more preferably 7.5 to 25 nm, and particularly preferably 10 to 20 nm from the viewpoint of a magnetic coercive force Hc" described in the above-described (H) has been supported also by the results of Examples 41 to 53.

From the results of Examples 41 to 43, the effects of provision of the plurality of in-plane magnetized films have been confirmed when the total thickness of the in-plane magnetized films is 30 nm. From the results of Examples 44 to 53, the effects of provision of the plurality of in-plane magnetized films have been confirmed when the total thickness of the in-plane magnetized films is 100 nm.

(J) Analysis of Composition of In-Plane Magnetized Films (Examples 45, 47, 50, and 52)

The compositions of the in-plane magnetized films of Examples 45, 47, 50, and 52 were analyzed. An outline of steps of a composition analysis method performed will be described, and thereafter concrete contents of each step will further be described.

[Outline of steps] Linear analysis is performed to analyze the composition in a thickness direction of an in-plane magnetized film, and a portion having less variation in the composition is chosen from linearly analyzed portions in cross section in the thickness direction of the in-plane magnetized film (Steps 1 to 4). Linear analysis is performed to analyze the composition in a range of 100 nm (at 167 measurement points) in an in-plane direction of the in-plane magnetized film around an optional measurement point included in the portion having less variation in the composition (Step 5). An average value of detected strengths at 167 measurement points is calculated on a detected element basis, to determine the composition of the in-plane magnetized film (Step 6). Steps 1 to 6 will be hereinafter described in the concrete.

Figure 3:
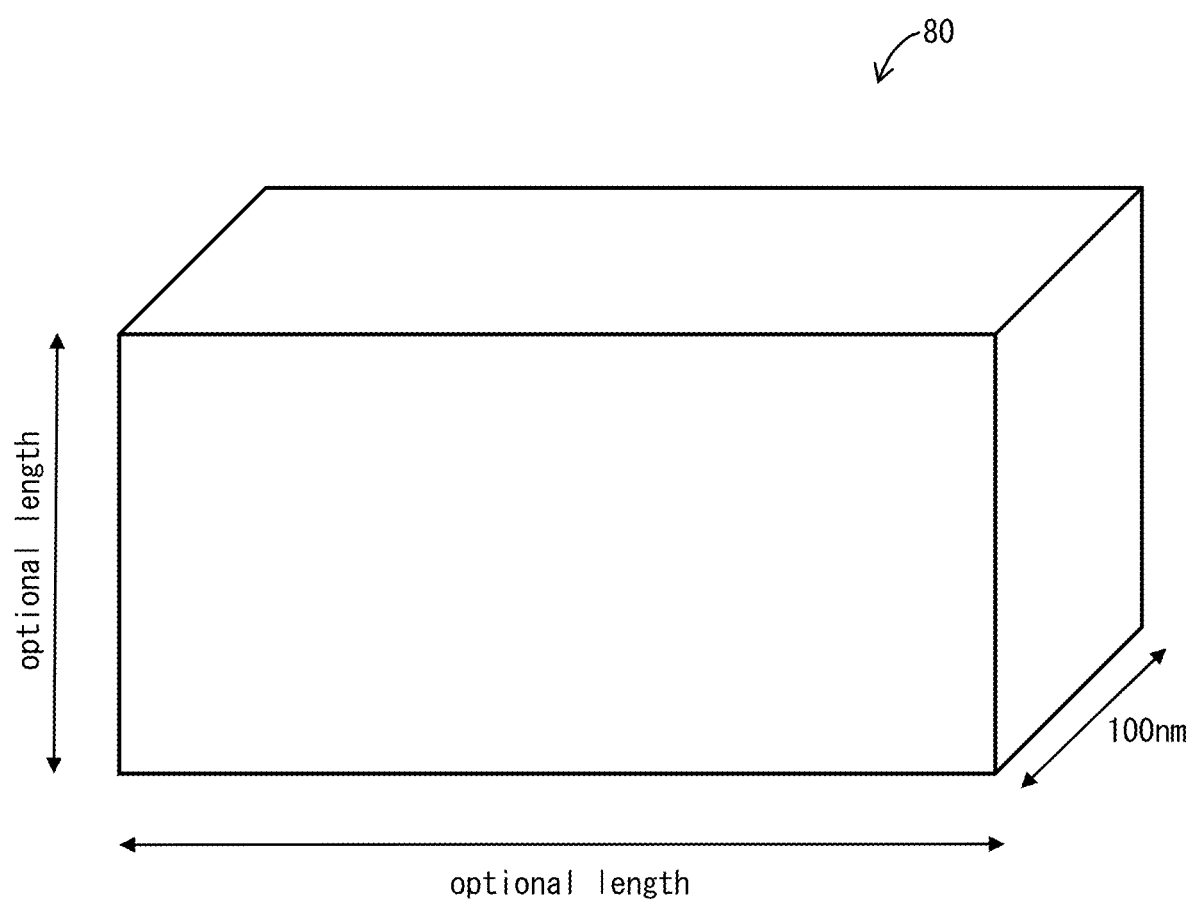
FIG. 3 is a diagrammatic perspective view schematically showing the form of a thinned sample 80 after being subjected to thinning processing.

[Step 1] An in-plane magnetized film the composition of which was to be analyzed is cut by parallel two planes in a direction (a thickness direction of the in-plane magnetized film) orthogonal to an in-plane direction, and thinning processing is performed by a FIB method (μ-sampling method) until the distance between the obtained two parallel cutting planes becomes about 100 nm. FIG. 3 schematically shows the shape of a thinned sample 80 after having been subjected to the thinning processing. As shown in FIG. 3, the shape of the thinned sample 80 is in an approximately rectangular parallelepiped shape. The distance between the two parallel cutting planes is about 100 nm, and the length of a side of the rectangular parallelepiped thinned sample 80 in the in-plane direction is about 100 nm, but the lengths of other two sides may be appropriately determined as long as the thinned sample 80 is observable by a scanning transmission electron microscope.

Figure 4:
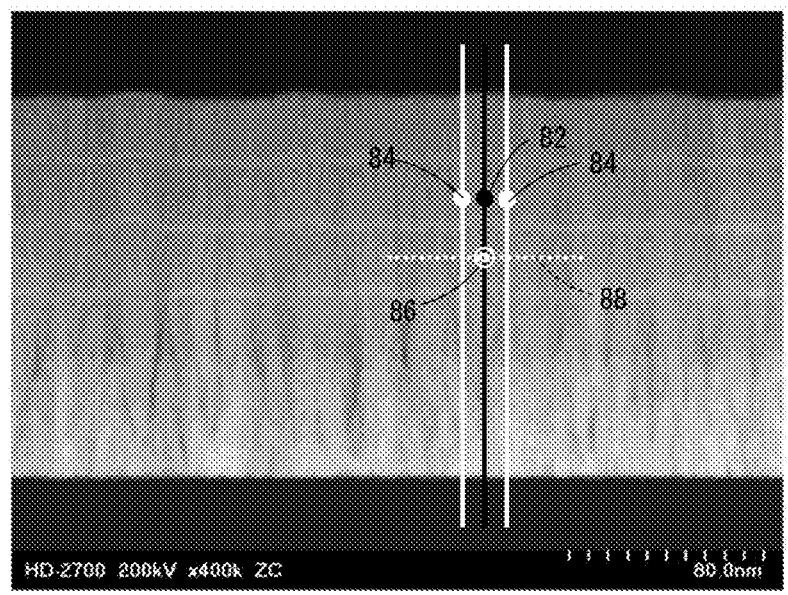
FIG. 4 is an example of an observation image (an observation image of Example 45) obtained by imaging with a scanning transmission electron microscope.

[Step 2] The cutting plane (the cutting plane of the in-plane magnetized film in the thickness direction) of the thinned sample 80 obtained in Step 1 is imaged using the scanning transmission electron microscope that allows observation with magnifying a length of 100 nm into 2 cm (observation at a magnification of two hundred thousand times), and an observation image is captured. The rectangular observation image is captured such that a line of a crossing portion of a topmost surface of the in-plane magnetized film to be observed and the cutting plane (the cutting plane in the thickness direction of the in-plane magnetized film) coincides with a longitudinal direction of the rectangular observation image. FIG. 4 shows an example (observation image of Example 45) of the captured observation image. The observation image of the in-plane magnetized film was captured using HD-2700 manufactured by Hitachi High-Tech Corporation.

[Step 3] An optional point (indicated by a black dot 82 in FIG. 4) included in the in-plane magnetized film is chosen from the observation image captured in Step 2, and positions (indicated by white dots 84 in FIG. 4) 10 nm away from the point to left and right in the longitudinal direction of the observation image are pointed. Linear analysis for elemental analysis is performed in the thickness direction of the in-plane magnetized film so as to pass the point of the black dot 82, and linear analysis for elemental analysis is performed in the thickness direction of the in-plane magnetized film so as to pass the points of the white dots 84. Thereby, linear analysis for elemental analysis is performed in the thickness direction of the in-plane magnetized film with respect to three lines (one line passing through the black dot in the thickness direction and two lines passing through the white dots in the thickness direction). At the time of performing the linear analysis for elemental analysis, it is necessary to choose the point of the one black dot 82 and the points of the two white dots 84 such that a scanning range of the linear analysis along the three lines corresponds to the entire range in the thickness direction of the in-plane magnetized film (when a target of composition analysis is an in-plane magnetized film multilayer structure, it is the entire range from an uppermost in-plane magnetized film to a lowermost in-plane magnetized film).

In composition analysis of the in-plane magnetized film, energy dispersive X-ray spectroscopy (EDX) was adopted as an element analysis technique, and EMAX Evolution manufactured by HORIBA, Ltd. was used as an elemental analyzer. Concrete analysis conditions were as follows. That is, a Si-drift detector was used as an X-ray detector, an X-ray take-off angle was 24.8°, a solid angle was approximately 2.2 sr, a dispersive crystal generally appropriate to each element was used, a measurement time was 2 seconds/point, a scanning interval was 0.6 nm, and an irradiation beam diameter was 0.2 nmϕ. The conditions described in this paragraph may be hereinafter referred to as "analysis conditions of Step 3".

Figure 5:
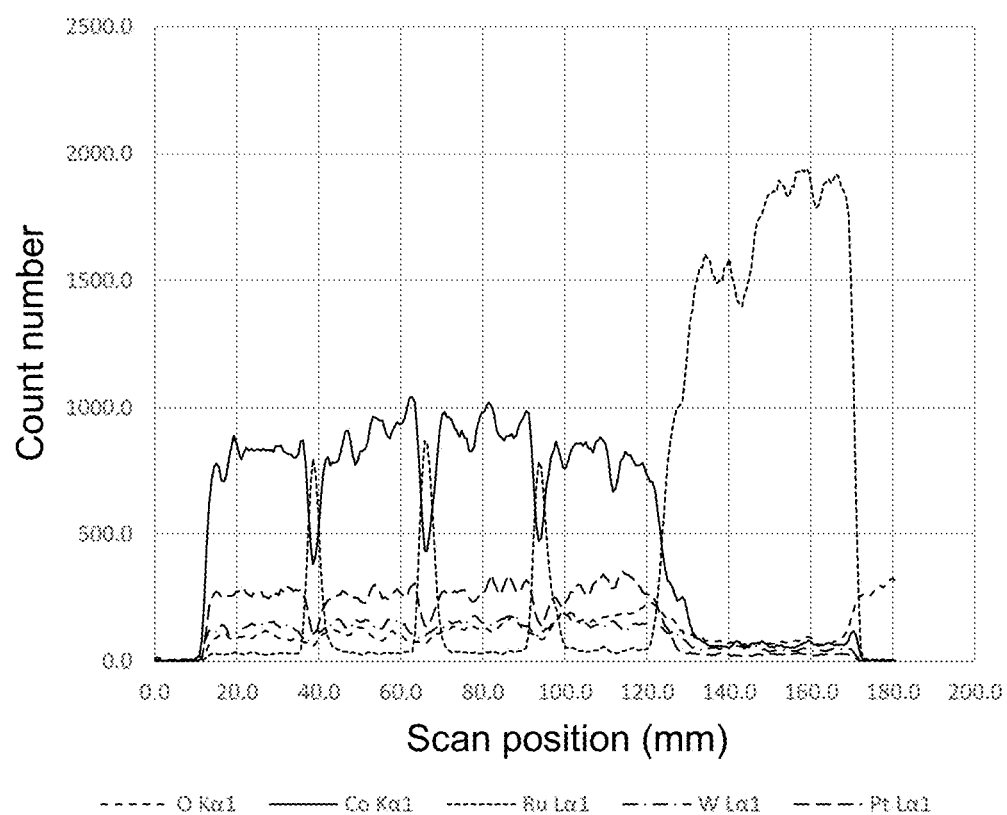
FIG. 5 is a result of linear analysis (elemental analysis) performed in a thickness direction of an in-plane magnetized film of the Example 45 (performed along a black line in FIG. 4).

FIG. 5 shows a result of the linear analysis (elemental analysis) performed along a black line (the line passing through the point of the black dot in the thickness direction of the in-plane magnetized film) in FIG. 4 (the observation image of Example 45). In FIG. 5, a vertical axis represents the detection strength of each element, and a horizontal axis represents a scan position. Elements shown in an explanatory note of FIG. 5 are elements that have been confirmed with sufficient detection strengths. In Example 45, the elements confirmed with sufficient detection strengths were Co, Pt, W, O, and Ru. In the composition analysis of Example 45, a K$\alpha$1-ray was chosen to detect Co and O, and a L$\alpha$1-ray was chosen to detect Pt, Ru, and W. Each detection strength was corrected by subtracting a detection strength of blank measurement measured in advance. In FIG. 4, a last end (lowermost end) of the linear analysis is a Si substrate. In this portion, only Si and O which is due to surface oxidation are detected in theory. Accordingly, a detection value of an element other than Si and O detected in this portion is conceivable to be an unavoidable detection error value in the elemental analyzer. Thus, the detection strength shall represent the presence of the element only when the detection strength is higher than the detection error value.

In Example 45 having an in-plane magnetized film multilayer structure, in-plane magnetized films each of which had a thickness of 25 nm were formed using a sputtering target having a composition of (Co-20Pt)-30 vol % $WO_3$. Also, metal Ru nonmagnetic intermediate layers each of which had a thickness of 2 nm between the in-plane magnetized films were formed to be positioned between the in-plane magnetized films. To form the metal Ru nonmagnetic intermediate layers, a sputtering target having a composition of 100 at % Ru was used.

As can be seen from the result of linear analysis shown in FIG. 5, Co, Pt, W, and O were mainly detected in the in-plane magnetized films, and Ru was mainly detected in the nonmagnetic intermediate layers. In the metal Ru nonmagnetic intermediate layers, detection strengths based on the constituent elements of the in-plane magnetized films are partly detected. This is because the elements of each of upper and lower adjacent layers are slightly diffused by sputtering heat during film formation. However, as far as seen from the distribution of each primary element of the in-plane magnetized films and the nonmagnetic intermediate layers, it was confirmed that film formation was performed as almost designed.

[Step 4] From the results of the linear analysis (the linear analysis for elemental analysis performed in the thickness direction of the in-plane magnetized films) performed in Step 3, an aggregation portion of measurement points having less variation in composition is chosen. The aggregation portion of the measurement points having less variation in composition is an aggregation portion of measurement points satisfying the following conditions a to c.

Condition a) The measurement points are measurement points of the linear analysis along any of the three lines performed in Step 3, and where the sum of the detection strengths of Co and Pt exceeds 1000 counts.

Condition b) When an X count represents the sum of the detection strengths of Co and Pt at the measurement point, and a Y count represents the sum of the detection strengths of Co and Pt at the next measurement point (a measurement point that is adjacent to and 0.6 nm downward away from the measurement point) after measurement is performed at the measurement point, $$Y/X-1<0.05$$

is satisfied.

Condition c) The measurement points are five or more consecutive measurement points that satisfy the conditions a and b.

The aggregation portion of the measurement points satisfying the conditions a to c contains five or more consecutive measurement points, and hence is in a linear area of 0.6 nm×4=2.4 nm or more. Therefore, the aggregation portion of the measurement points satisfying the conditions a to c is a linear area of a range of 2.4 nm or more in which at least one of Co or Pt is stably detected.

[Step 5] An optional measurement point is chosen from the aggregation of the measurement points chosen in Step 4, as a reference point (indicated by a double white circle 86 in FIG. 4) for composition analysis of the in-plane magnetized film. Composition analysis is performed in a linear area of 50 nm to left and right (a linear area of 100 nm in total, and shown by white broken lines 88 in FIG. 4) with respect to the reference point as a center in an in-plane direction (in the longitudinal direction of the observation image in FIG. 4) of the in-plane magnetized film the composition analysis of which is to be performed, in the same analysis conditions as that in Step 3. In the composition analysis, since linear analysis is performed on the linear area of 100 nm at scanning intervals of 0.6 nm, analysis results are obtained at 167 measurement points in total.

[Step 6] An average value of detected strengths (count numbers) of 167 measurement points is calculated on a detected element basis. The ratio of the average values of the detected strengths (count numbers) of the respective detected elements coincides with the composition ratio of the respective elements of the in-plane magnetized film.

In analysis by EDX, it is unavoidable that fluorescent X-rays of a light element such as oxygen (O) are absorbed by fluorescent X-rays of a heavy element such as platinum (Pt), but the light element such as oxygen (O) and the heavy element such as platinum (Pt) are mixed in the in-plane magnetized film according to the present invention. Therefore, as to oxygen (O), the composition of the in-plane magnetized film was determined on the assumption that a metal (W in Example 45) that was present as an oxide was totally oxidized (into $WO_3$ in Example 45) in an appropriate manner.

In Example 18, boron (B) oxide ($B_2O_3$) is used in the in-plane magnetized film, but boron (B) cannot be detected in analysis by EDX because boron (B) is a light element having a smaller atomic number than oxygen (O). Therefore, in the composition of the in-plane magnetized film according to Example 18, though the composition ratio of Co and Pt can be determined, the content of $B_2O_3$ cannot be determined.

INDUSTRIAL APPLICABILITY

The in-plane magnetized film, the in-plane magnetized film multilayer structure, the hard bias layer, the magnetoresistive element, and the sputtering target according to the present invention can achieve magnetic performance of a magnetic coercive force Hc of 2.00 kOe or more and remanent magnetization per unit area Mrt of 2.00 memu/cm$^2$ or more, without performing film formation with heating, and hence have industrial applicability.

REFERENCE SIGNS LIST 10 in-plane magnetized film
12, 24 magnetoresistive element
14, 26 hard bias layer
16, 28 free magnetic layer
20 in-plane magnetized film multilayer structure
22 nonmagnetic intermediate layer
50 insulating layer
52 pinned layer
54 barrier layer
80 thinned sample
82 black dot (optional point included in in-plane magnetized film)
84 white dot (points at positions 10 nm away from black dot 82 to left and right in longitudinal direction of observation image)
86 double white circle (reference point for composition analysis of in-plane magnetized film)
88 white broken line (linear area of 50 nm away from double white circle 86 (reference point) leftward and rightward in longitudinal direction of observation image)

The invention claimed is:
1. An in-plane magnetized film for use as a hard bias layer of a magnetoresistive element, the in-plane magnetized film comprising metal Co, metal Pt, and an oxide, wherein
the in-plane magnetized film contains the metal Co in an amount of 55 at % or more and less than 95 at % and the metal Pt in an amount of more than 5 at % and 45 at % or less relative to a total of metal components of the in-plane magnetized film, the in-plane magnetized film contains the oxide in an amount of 10 vol % or more and 42 vol % or less relative to a whole amount of the in-plane magnetized film, and the in-plane magnetized film has a thickness of 20 nm or more and 80 nm or less.

2. The in-plane magnetized film according to claim 1, having a granular structure constituted of CoPt alloy crystal grains and a crystal grain boundary made of the oxide.

3. The in-plane magnetized film according to claim 1, wherein the oxide contains at least one of a Ti oxide, a Si oxide, a W oxide, a B oxide, a Mo oxide, a Ta oxide, and a Nb oxide.

4. An in-plane magnetized film multilayer structure for use as a hard bias layer of a magnetoresistive element, the in-plane magnetized film multilayer structure comprising:
a plurality of in-plane magnetized films; and
a nonmagnetic intermediate layer, wherein
the nonmagnetic intermediate layer is disposed between the in-plane magnetized films, and the in-plane magnetized films adjacent across the nonmagnetic intermediate layer are coupled by a ferromagnetic coupling,
the in-plane magnetized film
contains metal Co, metal Pt, and an oxide,
contains the metal Co in an amount of 55 at % or more and less than 95 at % and the metal Pt in an amount of more than 5 at % and 45 at % or less relative to a total of metal components of the in-plane magnetized film, and
contains the oxide in an amount of 10 vol % or more and 42 vol % or less relative to a whole amount of the in-plane magnetized film, and
the in-plane magnetized film multilayer structure has a magnetic coercive force of 2.00 kOe or more and remanent magnetization per unit area of 2.00 memu/cm$^2$ or more.

5. An in-plane magnetized film multilayer structure for use as a hard bias layer of a magnetoresistive element, the in-plane magnetized film multilayer structure comprising:
a plurality of in-plane magnetized films; and
a nonmagnetic intermediate layer a crystal structure of which is a hexagonal closest packed structure, wherein
the nonmagnetic intermediate layer is disposed between the in-plane magnetized films and the in-plane magnetized films adjacent across the nonmagnetic intermediate layer are coupled by a ferromagnetic coupling,
the in-plane magnetized film
contains metal Co, metal Pt, and an oxide,
contains the metal Co in an amount of 55 at % or more and less than 95 at % and the metal Pt in an amount of more than 5 at % and 45 at % or less relative to a total of metal components of the in-plane magnetized film, and
contains the oxide in an amount of 10 vol % or more and 42 vol % or less relative to a whole amount of the in-plane magnetized film, and
a total thickness of the plurality of in-plane magnetized films is 20 nm or more.

6. The in-plane magnetized film multilayer structure according to claim 4, wherein the nonmagnetic intermediate layer is made of Ru or a Ru alloy.

7. The in-plane magnetized film multilayer structure according to claim 4, wherein the in-plane magnetized films are configured to have a granular structure constituted of CoPt alloy crystal grains and a crystal grain boundary made of the oxide.

8. The in-plane magnetized film multilayer structure according to claim 4, wherein the oxide contains at least one of a Ti oxide, a Si oxide, a W oxide, a B oxide, a Mo oxide, a Ta oxide, and a Nb oxide.

9. The in-plane magnetized film multilayer structure according to claim 4, wherein a thickness per one layer of the in-plane magnetized films is 5 nm or more and 30 nm or less.

10. A hard bias layer comprising the in-plane magnetized film according to claim 1.

11. A magnetoresistive element comprising the hard bias layer according to claim 10.

12. A sputtering target for use in forming an in-plane magnetized film for use as at least part of a hard bias layer of a magnetoresistive element by room temperature film formation, wherein
the sputtering target
contains metal Co, metal Pt, and an oxide,
contains the metal Co in an amount of 60 at % or more and less than 95 at % and the metal Pt in an amount of more than 5 at % and 40 at % or less relative to a total of metal components of the sputtering target, and
contains the oxide in an amount of 10 vol % or more and 40 vol % or less relative to a whole amount of the sputtering target, and
the in-plane magnetized film to be formed has a magnetic coercive force of 2.00 kOe or more and remanent magnetization per unit area of 2.00 memu/cm$^2$ or more.

13. The in-plane magnetized film multilayer structure according to claim 5, wherein the nonmagnetic intermediate layer is made of Ru or a Ru alloy.

14. The in-plane magnetized film multilayer structure according to claim 5, wherein the in-plane magnetized films are configured to have a granular structure constituted of CoPt alloy crystal grains and a crystal grain boundary made of the oxide.

15. The in-plane magnetized film multilayer structure according to claim 5, wherein the oxide contains at least one of a Ti oxide, a Si oxide, a W oxide, a B oxide, a Mo oxide, a Ta oxide, and a Nb oxide.

16. The in-plane magnetized film multilayer structure according to claim 5, wherein a thickness per one layer of the in-plane magnetized films is 5 nm or more and 30 nm or less.

17. A hard bias layer comprising the in-plane magnetized film multilayer structure according to claim 4.

18. A hard bias layer comprising the in-plane magnetized film multilayer structure according to claim 5.

19. A magnetoresistive element comprising the hard bias layer according to claim 17.

20. A magnetoresistive element comprising the hard bias layer according to claim 18.

* * * * *